(12) United States Patent
Mizukoshi

(10) Patent No.: US 12,426,489 B2
(45) Date of Patent: Sep. 23, 2025

(54) METHOD OF MANUFACTURING DISPLAY DEVICE

(71) Applicant: Magnolia White Corporation, Tokyo (JP)

(72) Inventor: Hirofumi Mizukoshi, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 363 days.

(21) Appl. No.: 18/156,418

(22) Filed: Jan. 19, 2023

(65) Prior Publication Data

US 2023/0232699 A1    Jul. 20, 2023

(30) Foreign Application Priority Data

Jan. 20, 2022 (JP) ................ 2022-007335

(51) Int. Cl.
*H10K 71/20* (2023.01)
*H10K 71/60* (2023.01)

(52) U.S. Cl.
CPC ......... *H10K 71/231* (2023.02); *H10K 71/60* (2023.02)

(58) Field of Classification Search
CPC .. H10K 59/1201; H10K 59/122; H10K 59/95; H10K 71/10–236; H10K 71/60
See application file for complete search history.

(56) References Cited

U.S. PATENT DOCUMENTS

| | | | |
|---|---|---|---|
| 8,193,018 B2 * | 6/2012 | Cok ............... | H10K 71/166 438/42 |
| 2004/0160170 A1 | 8/2004 | Sato et al. | |
| 2009/0009069 A1 | 1/2009 | Takata | |
| 2013/0084531 A1 * | 4/2013 | Hamaguchi ....... | H10K 71/233 430/319 |
| 2013/0084667 A1 * | 4/2013 | Otsuka .............. | H10K 59/35 438/46 |
| 2016/0248039 A1 * | 8/2016 | Choung ............ | H10K 50/828 |
| 2019/0363275 A1 | 11/2019 | Ochi et al. | |

FOREIGN PATENT DOCUMENTS

| | | |
|---|---|---|
| JP | 2000-195677 A | 7/2000 |
| JP | 2004-207217 A | 7/2004 |
| JP | 2008-135325 A | 6/2008 |
| JP | 2009-32673 A | 2/2009 |
| JP | 2010-118191 A | 5/2010 |
| WO | 2018/179308 A1 | 10/2018 |

\* cited by examiner

*Primary Examiner* — Andres Munoz
(74) *Attorney, Agent, or Firm* — XSENSUS LLP

(57) ABSTRACT

According to one embodiment, a method of manufacturing a display device, includes forming a first thin film including a first light-emitting layer over a first subpixel, a second subpixel, and a third subpixel, removing the first thin film of the second subpixel, forming a second thin film including a second light-emitting layer over the first subpixel, the second subpixel, and the third subpixel, removing the second thin film of the first subpixel and the third subpixel, removing the first thin film of the third subpixel, forming a third thin film including a third light-emitting layer over the first subpixel, the second subpixel, and the third subpixel, and removing the third thin film of the first subpixel and the second subpixel.

11 Claims, 22 Drawing Sheets

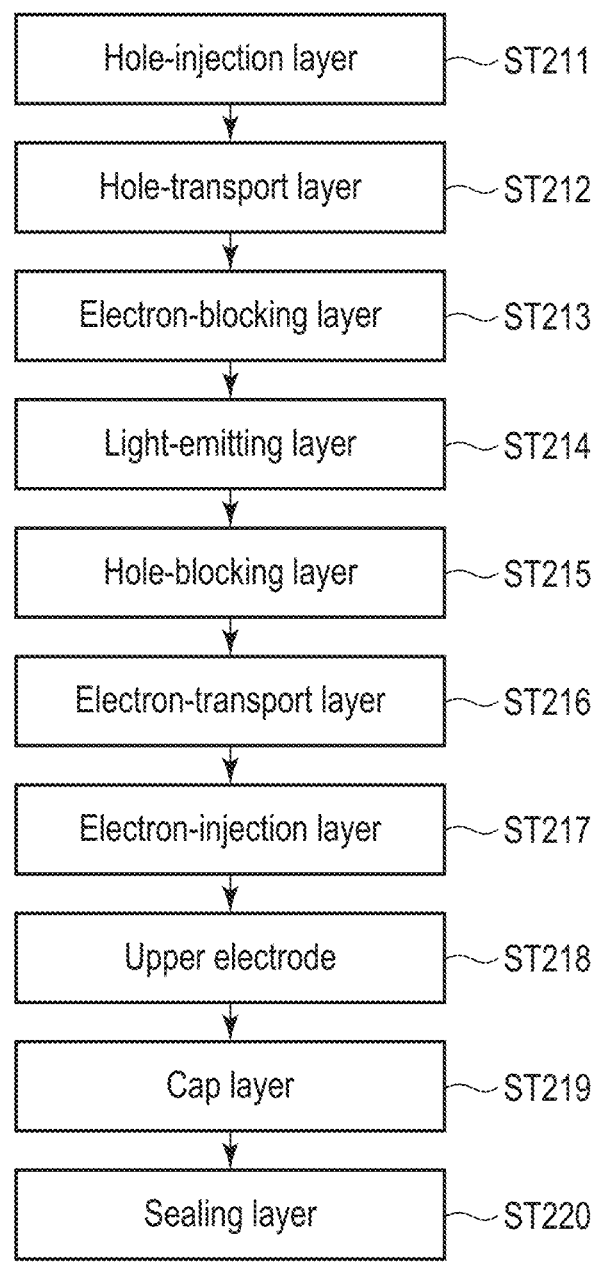
F I G. 6

METHOD OF MANUFACTURING DISPLAY DEVICE

CROSS-REFERENCE TO RELATED APPLICATIONS

This application is based upon and claims the benefit of priority from Japanese Patent Application No. 2022-007335, filed Jan. 20, 2022, the entire contents of which are incorporated herein by reference.

FIELD

Embodiments described herein relate generally to a method of manufacturing a display device.

BACKGROUND

In recent years, display devices to which organic light-emitting diodes (OLEDs) are applied as display elements have been put into practice. The display elements comprise a pixel circuit including a thin-film transistor, a lower electrode connected to the pixel electrode, an organic layer covering the lower electrode, and an upper electrode covering the organic layer. The organic layer includes functional layers such as a hole-transport layer and an electron-transport layer in addition to a light-emitting layer.

Such display elements easily deteriorate because of moisture. For this reason, a technique for surely sealing the display elements has been required.

BRIEF DESCRIPTION OF THE DRAWINGS

FIG. 6 is a flowchart for explaining an example of a thin-film formation step.

DETAILED DESCRIPTION

Figure 1:
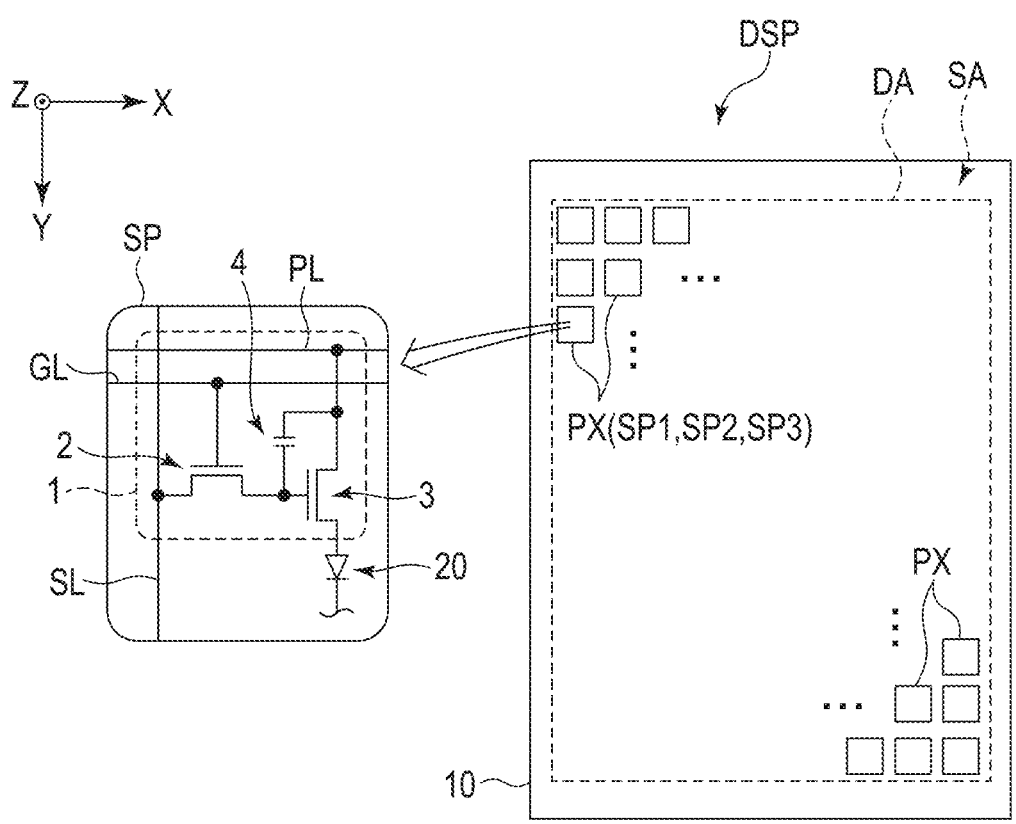
FIG. 1 is a diagram showing a configuration example of a display device DSP.

The embodiments described herein aim to provide a method of manufacturing a display device which can improve reliability.

In general, according to one embodiment, a method of manufacturing a display device, comprises, preparing a processing substrate comprising a first subpixel, a second subpixel, and a third subpixel, forming a first thin film including a first light-emitting layer over the first subpixel, the second subpixel, and the third subpixel, forming a first resist which exposes the first thin film of the second subpixel and which covers the first thin film of the first subpixel and the third subpixel, removing the first thin film of the second subpixel with the first resist used as a mask, removing the first resist, forming a second thin film including a second light-emitting layer over the first subpixel, the second subpixel, and the third subpixel, forming a second resist which exposes the second thin film of the first subpixel and the third subpixel and which covers the second thin film of the second subpixel, removing the second thin film of the first subpixel and the third subpixel with the second resist used as a mask, removing the second resist, forming a third resist which exposes the first thin film of the third subpixel and which covers the first thin film of the first subpixel and the second thin film of the second subpixel, removing the first thin film of the third subpixel with the third resist used as a mask, removing the third resist, forming a third thin film including a third light-emitting layer over the first subpixel, the second subpixel, and the third subpixel, forming a fourth resist which exposes the third thin film of the first subpixel and the second subpixel and which covers the third thin film of the third subpixel, removing the third thin film of the first subpixel and the second subpixel with the fourth resist used as a mask, and removing the fourth resist.

The embodiments can provide a method of manufacturing a display device which can improve reliability.

Embodiments will be described hereinafter with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction. A direction parallel to the Y-axis is referred to as a second direction. A direction parallel to the Z-axis is referred to as a third direction. Viewing an element in an X-Y plane defined by the X-axis and the Y-axis is referred to as planar view.

In addition, the terms representing the positional relationship between two or more structural elements, such as "on" and "above", include a case where the two or more structural elements are separated from each other with a gap or another structural element interposed therebetween, as well as a case where the two or more structural elements are in direct contact with each other.

A display device according to the present embodiment is an organic electroluminescent display device comprising an organic light-emitting diode (OLED) as a display element, and can be mounted in a television, a personal computer, in-vehicle equipment, a tablet terminal, a smartphone, a mobile telephone, etc.

FIG. 1 is a diagram showing a configuration example of a display device DSP.

The display device DSP comprises a display area DA where an image is displayed and a surrounding area SA surrounding the display area DA on an insulating substrate 10. The substrate 10 may be glass or a flexible resin film.

In the present embodiment, the shape of the substrate 10 in planar view is a rectangle. However, the shape of the substrate 10 in planar view is not limited to a rectangle, and may be another shape such as a square, a circle, or an ellipse.

The display area DA comprises pixels PX arrayed in a matrix in the first direction X and the second direction Y. The pixels PX include subpixels SP. For example, the pixels PX include a red subpixel SP1, a green subpixel SP2, and a blue subpixel SP3. The pixels PX may include a subpixel SP of another color such as white, in addition to the subpixels SP1, SP2, and SP3 or instead of one of the subpixels SP1, SP2, and SP3.

The subpixels SP each comprise a pixel circuit 1 and a display element 20 driven by the pixel circuit 1. The pixel circuit 1 comprises a pixel switch 2, a drive transistor 3, and a capacitor 4. The pixel switch 2 and the drive transistor 3 are, for example, switching elements composed of thin-film transistors.

A gate electrode of the pixel switch 2 is connected to a scanning line GL. One of a source electrode and a drain electrode of the pixel switch 2 is connected to a signal line SL, and the other is connected to a gate electrode of the drive transistor 3 and the capacitor 4. One of a source electrode and a drain electrode of the drive transistor 3 is connected to a power line PL and the capacitor 4, and the other is connected to an anode of the display element 20.

The configuration of the pixel circuit 1 is not limited to the example shown in the figure. For example, the pixel circuit 1 may comprise more thin-film transistors and capacitors.

The display elements 20 are organic light-emitting diodes (OLEDs) as light-emitting elements, and may be referred to as organic EL elements. For example, the subpixel SP1 comprises the display element 20 which emits light in the red wavelength range, the subpixel SP2 comprises the display element 20 which emits light in the green wavelength range, and the subpixel SP3 comprises the display element 20 which emits light in the blue wavelength range.

Figure 2:
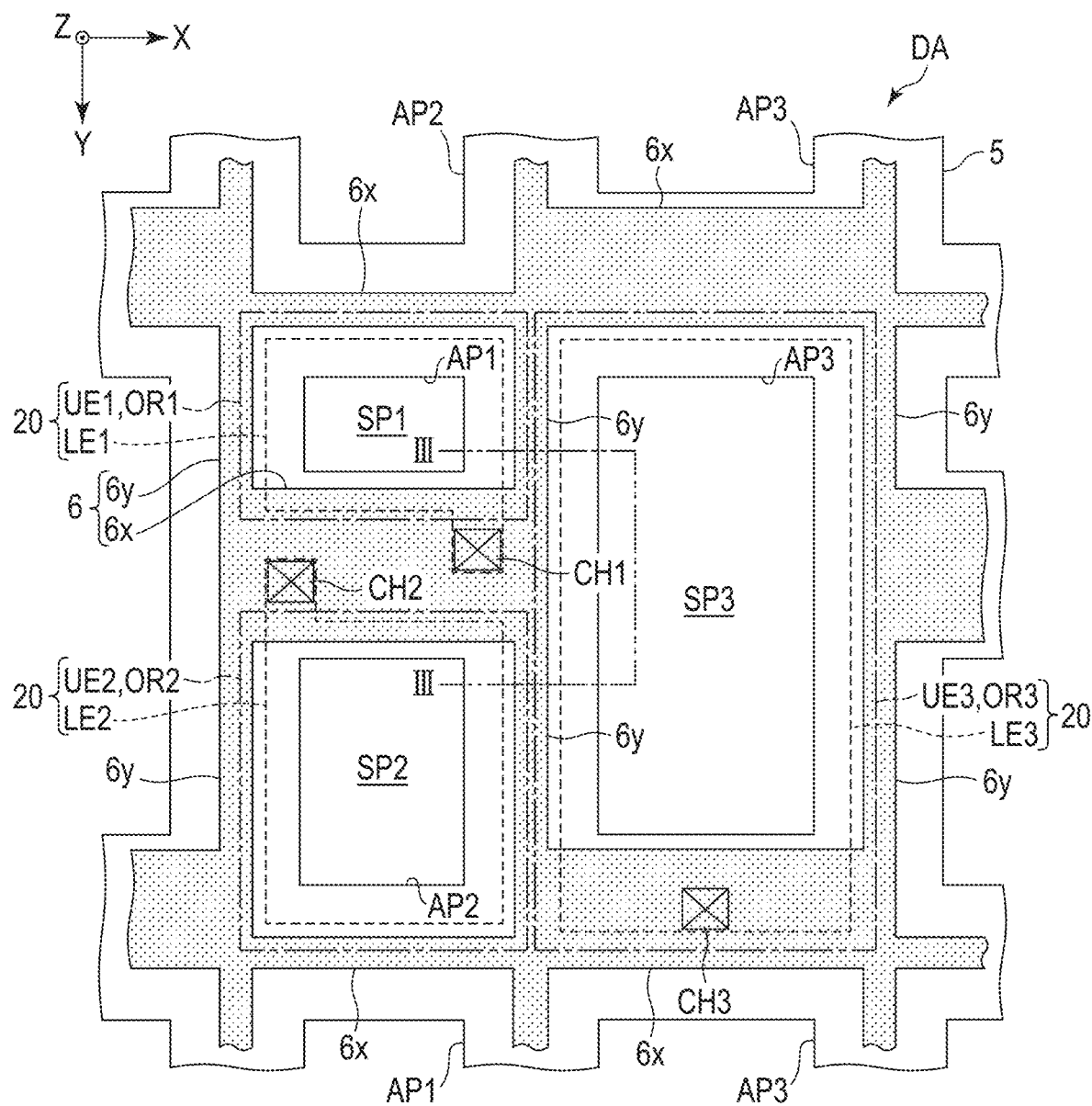
FIG. 2 is a diagram showing an example of the layout of subpixels SP1, SP2, and SP3.

FIG. 2 is a diagram showing an example of the layout of the subpixels SP1, SP2, and SP3.

In the example of FIG. 2, the subpixel SP1 and the subpixel SP2 are arranged in the second direction Y. Moreover, the subpixels SP1 and SP3 and the subpixels SP2 and SP3 are arranged in the first direction X.

If the subpixels SP1, SP2, and SP3 have the above-described layout, a column of subpixels SP1 and SP2 disposed alternately in the second direction Y and a column of subpixels SP3 disposed in the second direction Y are formed in the display area DA. These columns are arranged alternately in the first direction X.

The layout of the subpixels SP1, SP2, and SP3 is not limited to the example of FIG. 2. As another example, the subpixels SP1, SP2, and SP3 in each of the pixels PX may be arranged in order in the first direction X.

In the display area DA, a rib 5 and a partition 6 are disposed. The rib 5 comprises apertures AP1, AP2, and AP3 in the subpixels SP1, SP2, and SP3, respectively. In the example of FIG. 2, the apertures AP2 are larger than the apertures AP1, and the apertures AP3 are larger than the apertures AP2.

The partition 6 overlaps the rib 5 in planar view. The partition 6 comprises first partitions 6x extending in the first direction X and second partitions 6y extending in the second direction Y. The first partitions 6x are disposed between the apertures AP1 and AP2 adjacent to each other in the second direction Y and between the two apertures AP3 adjacent to each other in the second direction Y, respectively. The second partitions 6y are disposed between the apertures AP1 and AP3 adjacent to each other in the first direction X and between the apertures AP2 and AP3 adjacent to each other in the first direction X, respectively.

In the example of FIG. 2, the first partitions 6x and the second partitions 6y are connected to each other. The partition 6 is thereby formed into a latticed form surrounding the apertures AP1, AP2, and AP3 as a whole. It is also possible to say that the partition 6 comprises apertures in the subpixels SP1, SP2, and SP3 in the same way as the rib 5.

The subpixel SP1 comprises a lower electrode LE1, an upper electrode UE1, and an organic layer OR1 each overlapping the aperture AP1. The subpixel SP2 comprises a lower electrode LE2, an upper electrode UE2, and an organic layer OR2 each overlapping the aperture AP2. The subpixel SP3 comprises a lower electrode LE3, an upper electrode UE3, and an organic layer OR3 each overlapping the aperture AP3.

In the example of FIG. 2, the external shapes of the lower electrodes LE1, LE2, and LE3 are represented by broken lines and the external shapes of the organic layers OR1, OR2, and OR3 and the upper electrodes UE1, UE2, and UE3 are represented by alternate long and short dashed lines. The respective peripheries of the lower electrodes LE1, LE2, and LE3 overlap the rib 5. The external shape of the upper electrode UE1 is substantially identical to the external shape of the organic layer OR1, and the respective peripheries of the upper electrode UE1 and the organic layer OR1 overlap the partition 6. The external shape of the upper electrode UE2 is substantially identical to the external shape of the organic layer OR2, and the respective peripheries of the upper electrode UE2 and the organic layer OR2 overlap the partition 6. The external shape of the upper electrode UE3 is substantially identical to the external shape of the organic layer OR3, and the respective peripheries of the upper electrode UE3 and the organic layer OR3 overlap the partition 6.

The lower electrode LE1, the upper electrode UE1, and the organic layer OR1 constitute the display element 20 of the subpixel SP1. The lower electrode LE2, the upper electrode UE2, and the organic layer OR2 constitute the display element 20 of the subpixel SP2. The lower electrode LE3, the upper electrode UE3, and the organic layer OR3 constitute the display element 20 of the subpixel SP3. The lower electrodes LE1, LE2, and LE3 correspond to, for example, anodes of the display elements 20. The upper electrodes UE1, UE2, and UE3 correspond to cathodes or common electrodes of the display elements 20.

The lower electrode LE1 is connected to the pixel circuit 1 (refer to FIG. 1) of the subpixel SP1 through a contact hole CH1. The lower electrode LE2 is connected to the pixel circuit 1 of the subpixel SP2 through a contact hole CH2. The lower electrode LE3 is connected to the pixel circuit 1 of the subpixel SP3 through a contact hole CH3.

Figure 3:
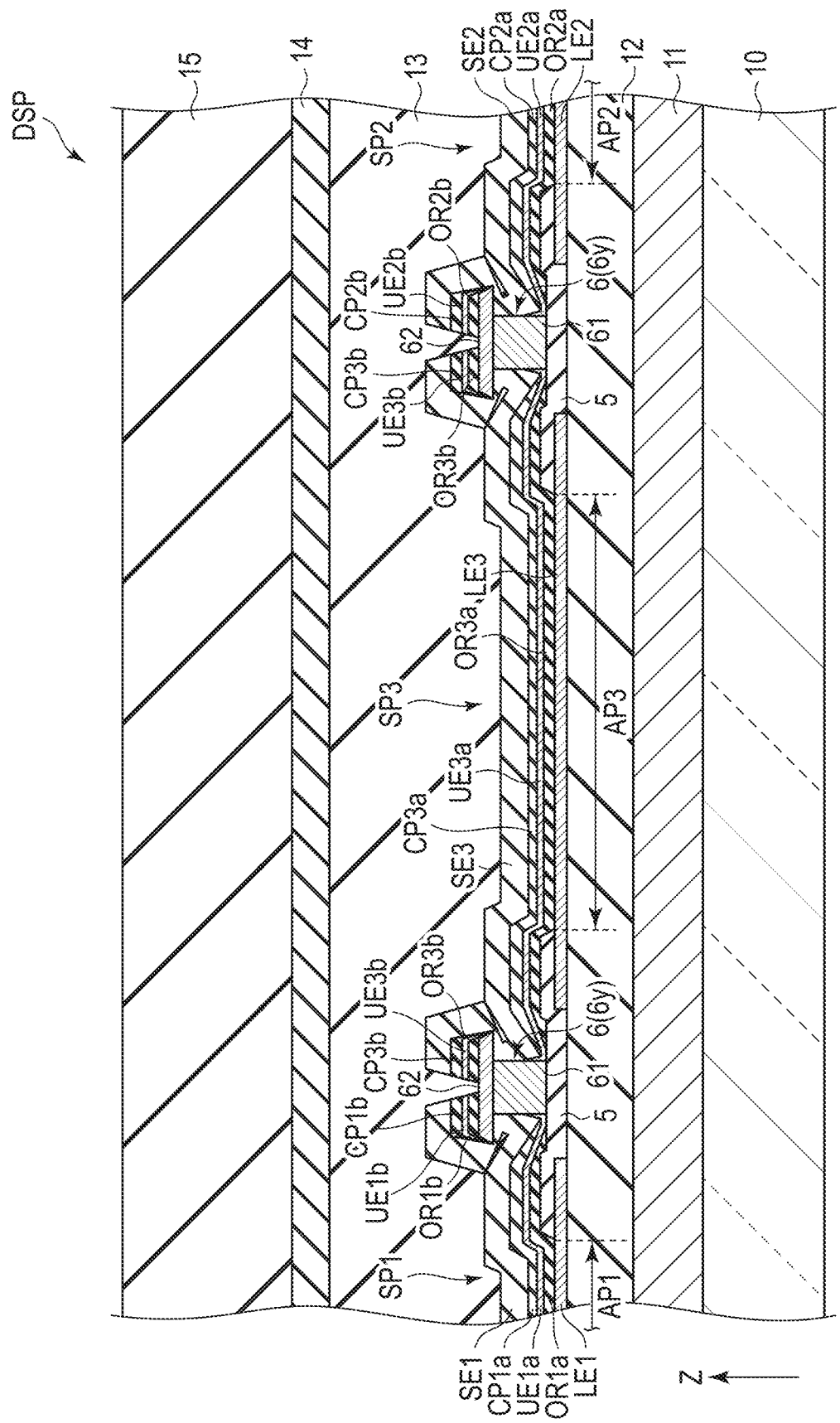
FIG. 3 is a schematic cross-sectional view of the display device DSP along line III-III in FIG. 2.

FIG. 3 is a schematic cross-sectional view of the display device DSP along line III-III in FIG. 2.

A circuit layer 11 is disposed on the above-described substrate 10. The circuit layer 11 includes various circuits such as the pixel circuit 1, and various lines such as the scanning line GL, the signal line SL, and the power line PL shown in FIG. 1. The circuit layer 11 is covered by an insulating layer 12. The insulating layer 12 functions as a planarizing film which planarizes irregularities caused by the circuit layer 11.

The lower electrodes LE1, LE2, and LE3 are disposed on the insulating layer 12. The rib 5 is disposed on the insulating layer 12 and the lower electrodes LE1, LE2, and LE3. The end portions of the lower electrodes LE1, LE2, and LE3 are covered by the rib 5.

The partition 6 includes a lower portion (stem) 61 disposed on the rib 5 and an upper portion (shade) 62 covering an upper surface of the lower portion 61. The upper portion 62 has a width greater than that of the lower portion 61. For this reason, in FIG. 3, both end portions of the upper portion 62 project from side surfaces of the lower portion 61. Such a shape of the partition 6 also can be referred to as an overhang form.

The organic layer OR1 shown in FIG. 2 includes a first portion OR1a and a second portion OR1b separated from each other as shown in FIG. 3. The first portion OR1a contacts the lower electrode LE1 through the aperture AP1, covers the lower electrode LE1, and overlaps part of the rib 5. The second portion OR1b is located on the upper portion 62.

In addition, the upper electrode UE1 shown in FIG. 2 includes a first portion UE1a and a second portion UE1b separated from each other as shown in FIG. 3. The first portion UE1a is opposed to the lower electrode LE1 and is located on the first portion OR1a. Moreover, the first portion UE1a contacts a side surface of the lower portion 61. The second portion UE1b is located above the partition 6 and is located on the second portion OR1b.

The organic layer OR2 shown in FIG. 2 includes a first portion OR2a and a second portion OR2b separated from each other as shown in FIG. 3. The first portion OR2a contacts the lower electrode LE2 through the aperture AP2, covers the lower electrode LE2, and overlaps part of the rib 5. The second portion OR2b is located on the upper portion 62.

In addition, the upper electrode UE2 shown in FIG. 2 includes a first portion UE2a and a second portion UE2b separated from each other as shown in FIG. 3. The first portion UE2a is opposed to the lower electrode LE2 and is located on the first portion OR2a. Moreover, the first portion UE2a contacts a side surface of the lower portion 61. The second portion UE2b is located above the partition 6 and is located on the second portion OR2b.

The organic layer OR3 shown in FIG. 2 includes a first portion OR3a and a second portion OR3b separated from each other as shown in FIG. 3. The first portion OR3a contacts the lower electrode LE3 through the aperture AP3, covers the lower electrode LE3, and overlaps part of the rib 5. The second portion OR3b is located on the upper portion 62.

In addition, the upper electrode UE3 shown in FIG. 2 includes a first portion UE3a and a second portion UE3b separated from each other as shown in FIG. 3. The first portion UE3a is opposed to the lower electrode LE3 and is located on the first portion OR3a. Moreover, the first portion UE3a contacts a side surface of the lower portion 61. The second portion UE3b is located above the partition 6 and is located on the second portion OR3b.

In the example shown in FIG. 3, the subpixels SP1, SP2, and SP3 include cap layers (optical adjustment layers) CP1, CP2, and CP3 for adjusting the optical properties of light emitted by light-emitting layers of the organic layers OR1, OR2, and OR3.

The cap layer CP1 includes a first portion CP1a and a second portion CP1b separated from each other. The first portion CP1a is located at the aperture AP1 and is located on the first portion UE1a. The second portion CP1b is located above the partition 6 and is located on the second portion UE1b.

The cap layer CP2 includes a first portion CP2a and a second portion CP2b separated from each other. The first portion CP2a is located at the aperture AP2 and is located on the first portion UE2a. The second portion CP2b is located above the partition 6 and is located on the second portion UE2b.

The cap layer CP3 includes a first portion CP3a and a second portion CP3b separated from each other. The first portion CP3a is located at the aperture AP3 and is located on the first portion UE3a. The second portion CP3b is located above the partition 6 and is located on the second portion UE3b.

In the subpixels SP1, SP2, and SP3, sealing layers SE1, SE2, and SE3 are disposed, respectively. The sealing layer SE1 continuously covers the members of the subpixel SP1 including the first portion CP1a, the partition 6, and the second portion CP1b. The sealing layer SE2 continuously covers the members of the subpixel SP2 including the first portion CP2a, the partition 6, and the second portion CP2b. The sealing layer SE3 continuously covers the members of the subpixel SP3 including the first portion CP3a, the partition 6, and the second portion CP3b.

In the example of FIG. 3, the second portion OR1b, the second portion UE1b, the second portion CP1b, and the sealing layer SE1, which are located on the partition 6 between the subpixels SP1 and SP3, are separated from the second portion OR3b, the second portion UE3b, the second portion CP3b, and the sealing layer SE3, which are located on the partition 6 between the subpixels SP1 and SP3. In addition, the second portion OR2b, the second portion UE2b, the second portion CP2b, and the sealing layer SE2, which are located on the partition 6 between the subpixels SP2 and SP3, are separated from the second portion OR3b, the second portion UE3b, the second portion CP3b, and the sealing layer SE3, which are located on the partition 6 between the subpixels SP2 and SP3.

The sealing layers SE1, SE2, and SE3 are covered by a resin layer 13. The resin layer 13 is covered by a sealing layer 14. Moreover, the sealing layer 14 is covered by a resin layer 15.

The insulating layer 12 is formed of an organic material. The rib 5 and the sealing layers 14, SE1, SE2, and SE3 are formed of an inorganic material, for example, silicon nitride (SiNx). The thickness of the rib 5 formed of an inorganic material is sufficiently smaller than those of the partition 6 and the insulating layer 12. For example, the thickness of the rib 5 is 200 nm to 400 nm.

The lower portion 61 of the partition 6 is formed of a conductive material. Both of the lower portion 61 and the upper portion 62 of the partition 6 may have conductivity.

The lower electrodes LE1, LE2, and LE3 may be formed of a transparent conductive material such as ITO, or may have a multilayered structure of a metallic material such as silver (Ag) and a transparent conductive material. The upper electrodes UE1, UE2, and UE3 are formed of a metallic material, for example, an alloy of magnesium and silver (MgAg). The upper electrodes UE1, UE2, and UE3 may be formed of a transparent conductive material such as ITO.

If the electric potentials of the lower electrodes LE1, LE2, and LE3 are relatively higher than those of the upper electrodes UE1, UE2, and UE3, the lower electrodes LE1, LE2, and LE3 correspond to anodes and the upper electrodes UE1, UE2, and UE3 correspond to cathodes. In addition, if the electric potentials of the upper electrodes UE1, UE2, and UE3 are relatively higher than those of the lower electrodes LE1, LE2, and LE3, the upper electrodes UE1, UE2, and UE3 correspond to anodes and the lower electrodes LE1, LE2, and LE3 correspond to cathodes.

The organic layers OR1, OR2, and OR3 each include functional layers and a light-emitting layer. The respective light-emitting layers included in the organic layers OR1, OR2, and OR3 are formed of materials which emit light of wavelength ranges different from each other.

The cap layers CP1, CP2, and CP3 are formed of, for example, a multilayered body of transparent thin films. The multilayered body may include a thin film formed of an inorganic material and a thin film formed of an organic material as the thin films. The thin films have refractive indices different from each other. The materials of the thin films constituting the multilayered body are different from the materials of the upper electrodes UE1, UE2, and UE3 and are also different from the materials of the sealing layers SE1, SE2, and SE3. The cap layers CP1, CP2, and CP3 may be omitted.

The partition 6 is supplied with a common voltage. The common voltage is supplied to each of the first portions UE1a, UE2a, and UE3a of the upper electrodes, which contact the side surfaces of the lower portion 61. The lower electrodes LE1, LE2, and LE3 are supplied with a pixel voltage via the respective pixel circuits 1 of the subpixels SP1, SP2, and SP3.

When a potential difference is formed between the lower electrode LE1 and the upper electrode UE1, the light-emitting layer of the first portion OR1a of the organic layer OR1 emits light in the red wavelength range. When a potential difference is formed between the lower electrode LE2 and the upper electrode UE2, the light-emitting layer of the first portion OR2a of the organic layer OR2 emits light in the green wavelength range. When a potential difference is formed between the lower electrode LE3 and the upper electrode UE3, the light-emitting layer of the first portion OR3a of the organic layer OR3 emits light in the blue wavelength range.

As another example, the light-emitting layers of the organic layers OR1, OR2, and OR3 may emit light of the same color (for example, white). In this case, the display device DSP may comprise color filters which convert light emitted by the light-emitting layers into light of the colors corresponding to the subpixels SP1, SP2, and SP3. In addition, the display device DSP may comprise a layer including quantum dots which are excited by light emitted by the light-emitting layers to generate light of the colors corresponding to the subpixels SP1, SP2, and SP3.

Figure 4:
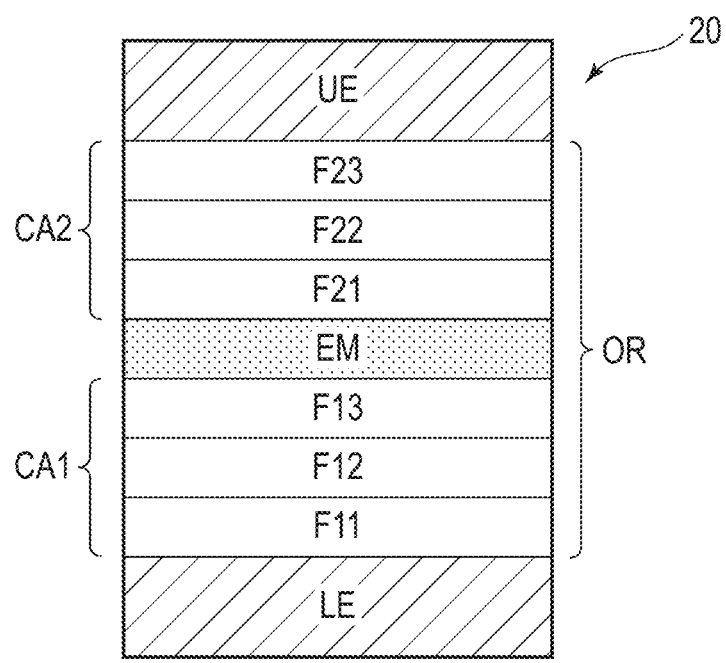
FIG. 4 is a diagram showing an example of the configuration of a display element 20.

FIG. 4 is a diagram showing an example of the configuration of the display element 20.

A lower electrode LE shown in FIG. 4 corresponds to each of the lower electrodes LE1, LE2, and LE3 of FIG. 3. An organic layer OR shown in FIG. 4 corresponds to each of the organic layers OR1, OR2, and OR3 of FIG. 3. An upper electrode UE shown in FIG. 4 corresponds to each of the upper electrodes UE1, UE2, and UE3 of FIG. 3.

The organic layer OR comprises a carrier adjustment layer CA1, a light-emitting layer EM, and a carrier adjustment layer CA2. The carrier adjustment layer CA1 is located between the lower electrode LE and the light-emitting layer EM, and the carrier adjustment layer CA2 is located between the light-emitting layer EM and the upper electrode UE. The carrier adjustment layers CA1 and CA2 each include functional layers. The following description explains a case where the lower electrode LE corresponds to an anode and the upper electrode UE corresponds to a cathode as an example.

The carrier adjustment layer CA1 includes a hole-injection layer F11, a hole-transport layer F12, an electron-blocking layer F13, etc., as the functional layers. The hole-injection layer F11 is located on the lower electrode LE, the hole-transport layer F12 is located on the hole-injection layer F11, the electron-blocking layer F13 is located on the hole-transport layer F12, and the light-emitting layer EM is located on the electron-blocking layer F13.

The carrier adjustment layer CA2 includes a hole-blocking layer F21, an electron-transport layer F22, an electron-injection layer F23, etc., as the functional layers. The hole-blocking layer F21 is located on the light-emitting layer EM, the electron-transport layer F22 is located on the hole-blocking layer F21, the electron-injection layer F23 is located on the electron-transport layer F22, and the upper electrode UE is located on the electron-injection layer F23.

The carrier adjustment layers CA1 and CA2 may include another functional layer such as a carrier generation layer as necessary in addition to the above functional layers, or at least one of the above functional layers may be omitted.

An example of a method of manufacturing the display device DSP will be described next.

Figure 5:
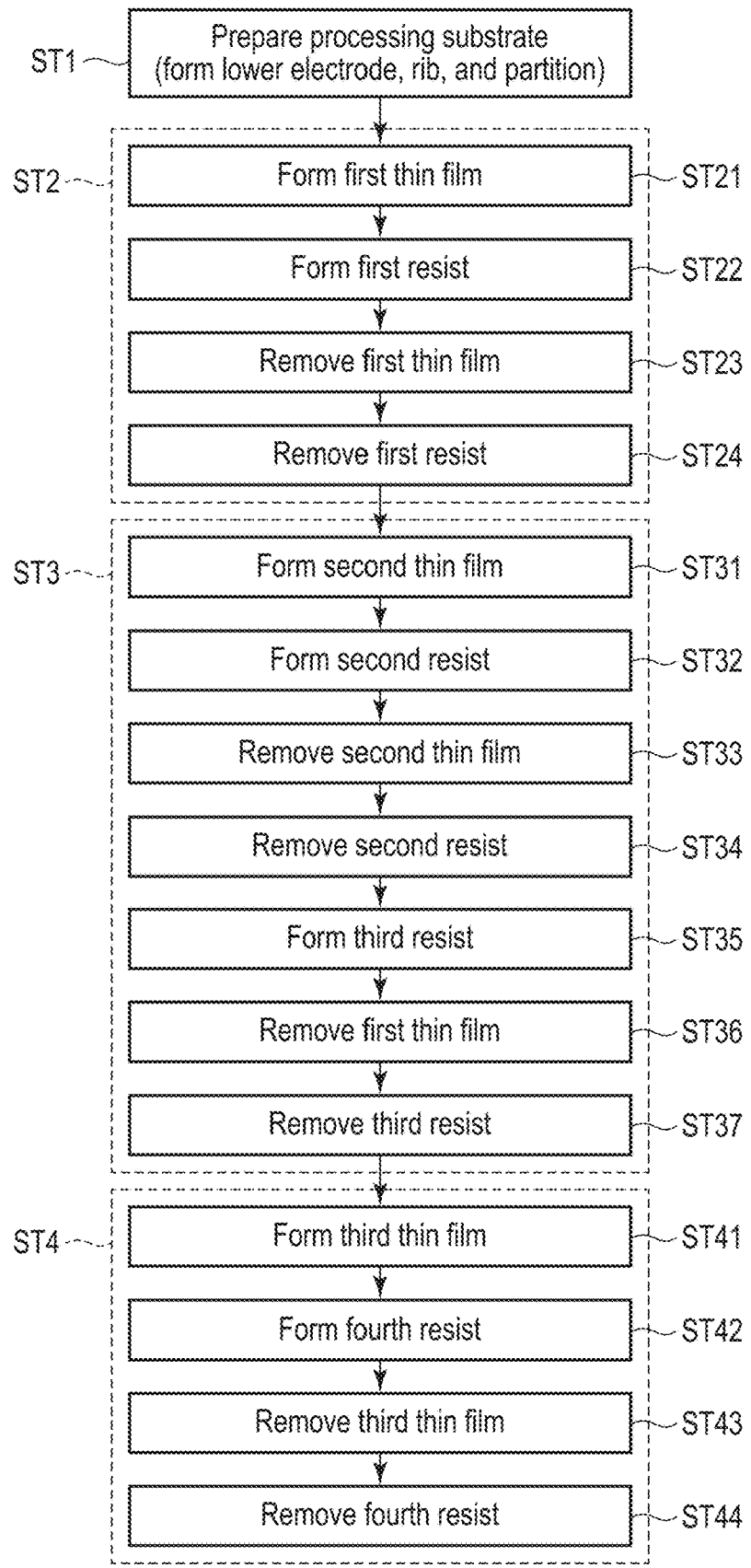
FIG. 5 is a flowchart for explaining an example of a method of manufacturing the display device DSP.

FIG. 5 is a flowchart for explaining an example of the method of manufacturing the display device DSP.

The manufacturing method described here broadly includes the steps of preparing a processing substrate SUB comprising a first subpixel SPα, a second subpixel SPβ, and a third subpixel SPγ (step ST1); forming a display element 21 of the first subpixel SPα (step ST2); forming a display element 22 of the second subpixel SPβ (step ST3); and forming a display element 23 of the third subpixel SPγ (step ST4). Each of the first subpixel SPα, the second subpixel SPβ, and the third subpixel SPγ described here is one of the above-described subpixels SP1, SP2, and SP3.

In step ST1, first, the processing substrate SUB, in which the lower electrode LE, the rib 5, and the partition 6 are formed on the substrate 10, is prepared. Details will be described later.

In step ST2, first, a first thin film 31 is formed on the processing substrate SUB (step ST21). Then, a first resist 41 patterned with a predetermined shape is formed on the first thin film 31 (step ST22). Then, part of the first thin film 31 is removed by etching with the first resist 41 used as a mask (step ST23). Then, the first resist 41 is removed (step ST24).

In this way, the display element 21 comprising the first thin film 31 having a predetermined shape is formed in the first subpixel SPα.

In step ST3, first, a second thin film 32 is formed on the processing substrate SUB (step ST31). Then, a second resist 42 patterned with a predetermined shape is formed on the second thin film 32 (step ST32). Then, part of the second thin film 32 is removed by etching with the second resist 42 used as a mask (step ST33). Then, the second resist 42 is removed (step ST34).

Then, a third resist 43 patterned with a predetermined shape is formed on the remaining first thin film 31 and second thin film 32 (step ST35). Then, part of the first thin film 31 is removed by etching with the third resist 43 used as a mask (step ST36). Then, the third resist 43 is removed (step ST37). In this way, the display element 22 comprising the second thin film 32 having a predetermined shape is formed in the second subpixel SPβ.

In step ST4, first, a third thin film 33 is formed on the processing substrate SUB (step ST41). Then, a fourth resist 44 patterned with a predetermined shape is formed on the third thin film 33 (step ST42). Then, part of the third thin film 33 is removed by etching with the fourth resist 44 used as a mask (step ST43). Then, the fourth resist 44 is removed (step ST44). In this way, the display element 23 comprising the third thin film 33 having a predetermined shape is formed in the third subpixel SPγ.

FIG. 6 is a flowchart for explaining an example of a thin-film formation step. Each of the first thin film 31, the second thin film 32, and the third thin film 33 described here comprises an organic layer OR, an upper electrode UE, and a sealing layer SE. In addition, the organic layer OR comprises the functional layers shown in FIG. 4.

The step of forming the first thin film 31 (step ST21), the step of forming the second thin film 32 (step ST31), and the step of forming the third thin film 33 (step ST41) each include the following steps.

First, a material for forming the hole-injection layer F11 is evaporated onto the processing substrate SUB (step ST211). In this way, the hole-injection layer F11, which contacts the lower electrode LE, is formed. The lower electrode LE here corresponds to one of the above-described lower electrodes LE1, LE2, and LE3.

Then, a material for forming the hole-transport layer F12 is evaporated onto the hole-injection layer F11 (step ST212). In this way, the hole-transport layer F12, which contacts the hole-injection layer F11, is formed.

Then, a material for forming the electron-blocking layer F13 is evaporated onto the hole-transport layer F12 (step ST213). In this way, the electron-blocking layer F13, which contacts the hole-transport layer F12, is formed.

Then, a material for forming the light-emitting layer EM is evaporated onto the electron-blocking layer F13 (step ST214). In this way, the light-emitting layer EM, which contacts the electron-blocking layer F13, is formed.

Then, a material for forming the hole-blocking layer F21 is evaporated onto the light-emitting layer EM (step ST215). In this way, the hole-blocking layer F21, which contacts the light-emitting layer EM, is formed.

Then, a material for forming the electron-transport layer F22 is evaporated onto the hole-blocking layer F21 (step ST216). In this way, the electron-transport layer F22, which contacts the hole-blocking layer F21, is formed.

Then, a material for forming the electron-injection layer F23 is evaporated onto the electron-transport layer F22 (step ST217). In this way, the electron-injection layer F23, which contacts the electron-transport layer F22, is formed.

Through steps ST211 to ST217, the organic layer OR is formed. The organic layer OR here corresponds to one of the above-described organic layers OR1, OR2, and OR3.

Then, a material for forming the upper electrode UE is evaporated onto the electron-injection layer F23 (step ST218). In this way, the upper electrode UE, which contacts the electron-injection layer F23 and the lower portion 61 of the partition 6 and which covers the organic layer OR, is formed. The upper electrode UE here corresponds to one of the above-described upper electrodes UE1, UE2, and UE3.

Then, a material for forming a cap layer CP is evaporated onto the upper electrode UE (step ST219). In this way, the cap layer CP, which contacts the upper electrode UE, is formed. The cap layer CP here corresponds to one of the above-described cap layers CP1, CP2, and CP3.

Then, the sealing layer SE covering the upper electrode UE, the cap layer CP, and the partition 6 is formed (step ST220). The sealing layer SE here corresponds to one of the above-described sealing layers SE1, SE2, and SE3.

Of the above-described steps, at least one of steps ST211 to ST213 and at least one of steps ST215 to ST217 may be omitted. In addition, the step of forming a functional layer constituting an organic layer may be added in addition to steps ST211 to ST217 described above.

In the following description, steps ST1 to ST4 will be explained specifically.

Figure 7:
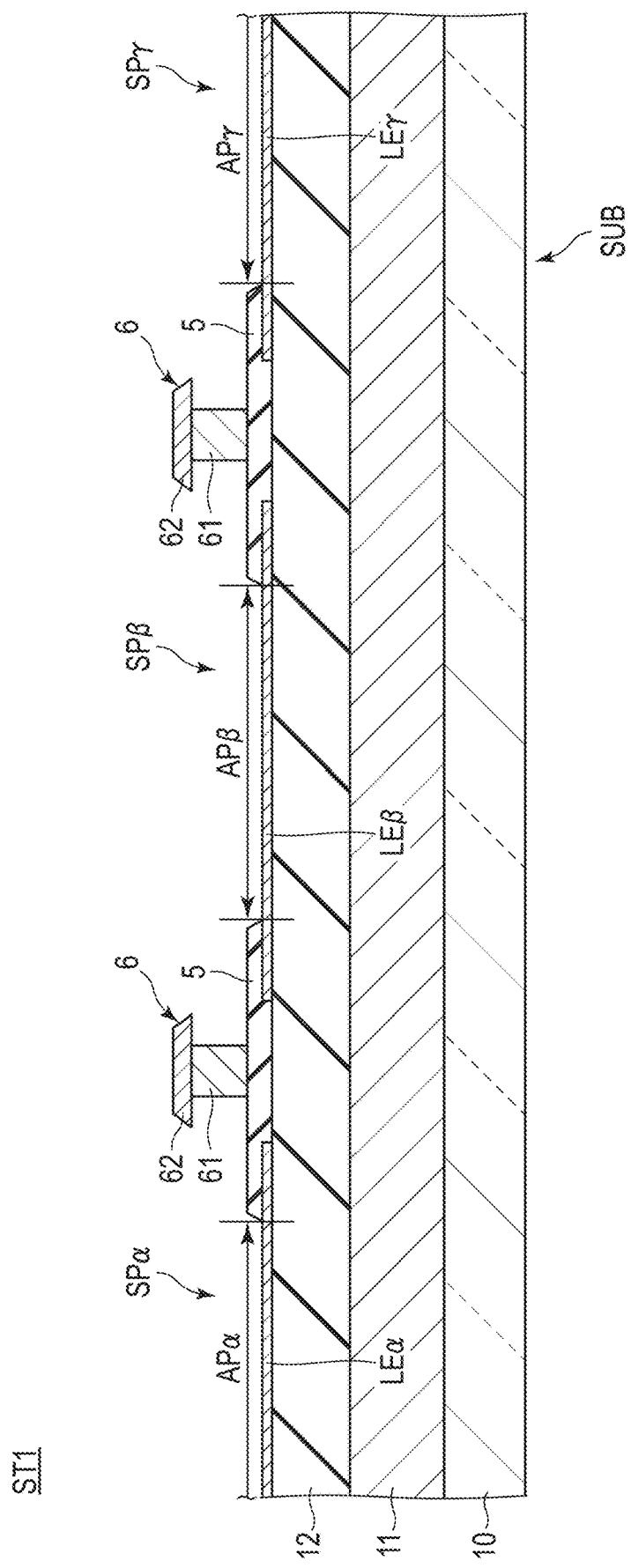
FIG. 7 is a diagram for explaining a step of preparing a processing substrate SUB.

The step of preparing the processing substrate SUB in step ST1 includes the following steps as shown in FIG. 7: forming a first lower electrode LEα of the first subpixel SPα, a second lower electrode LEβ of the second subpixel SPβ, and a third lower electrode LEγ of the third subpixel SPγ above the substrate 10; forming the rib 5 comprising apertures APα, APβ, and APγ which overlap the first lower electrode LEα, the second lower electrode LEβ, and the third lower electrode LEγ, respectively; and forming the partition 6 including the lower portion 61 which is disposed on the rib 5 and the upper portion 62 which is disposed on the lower portion 61 and projects from the side surfaces of the lower portion 61. The rib 5 here is formed of an inorganic material and the lower portion 61 is formed of a conductive material. In each of the figures referred to in the following description, the substrate 10 and the circuit layer 11, which are located lower than the insulating layer 12, will be omitted.

Figure 8:
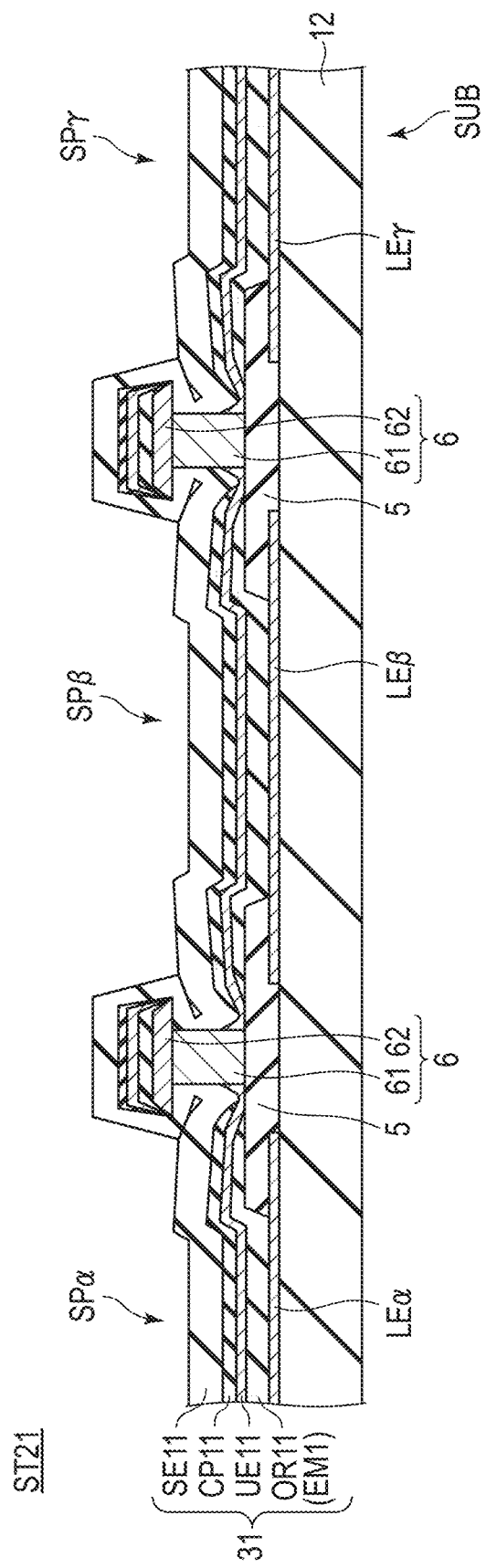
FIG. 8 is a diagram for explaining a step of forming a first thin film 31.

Then, in step ST21, as shown in FIG. 8, the first thin film 31 is formed over the first subpixel SPα, the second subpixel SPβ, and the third subpixel SPγ. The step of forming the first thin film 31 includes the steps of forming a first organic layer OR11 including a first light-emitting layer EM1 which emits light of a first color; forming a first upper electrode UE11 on the first organic layer OR11; forming a first cap layer CP11 on the first upper electrode UE11; and forming a first sealing layer SE11 on the first cap layer CP11. The first sealing layer SE11 here is formed of an inorganic material.

The first organic layer OR11 is formed on each of the first lower electrode LEα, the second lower electrode LEβ, and the third lower electrode LEγ and is also formed on the upper portion 62 of the partition 6. Of the first organic layer OR11, the portion formed on the upper portion 62 is separated from the portions formed on the lower electrodes.

The first upper electrode UE11 is formed on the first organic layer OR11 directly above each of the first lower electrode LEα, the second lower electrode LEβ, and the third lower electrode LEγ, and contacts the lower portion 61 of the partition 6. In addition, the first upper electrode UE11 is also formed on the first organic layer OR11 directly above the upper portion 62. For example, the first upper electrode UE11 covers the first organic layer OR11. Of the first upper electrode UE11, the portion formed directly above the upper portion 62 is separated from the portions formed directly above the lower electrodes.

The first cap layer CP11 is formed on the first upper electrode UE11 directly above each of the first lower electrode LEα, the second lower electrode LEβ, and the third lower electrode LEγ, and is also formed on the first upper electrode UE11 directly above the upper portion 62. Of the first cap layer CP11, the portion formed directly above the upper portion 62 is separated from the portions formed directly above the lower electrodes.

The first sealing layer SE11 is formed to cover the first cap layer CP11 and the partition 6. That is, the first sealing layer SE11 is formed on the first cap layer CP11 directly above each of the first lower electrode LEα, the second lower electrode LEβ, and the third lower electrode LEγ, and is also formed on the first cap layer CP11 directly above the upper portion 62. Of the first sealing layer SE11, the portion formed directly above the upper portion 62 is connected to the portions formed directly above the lower electrodes.

Figure 9:
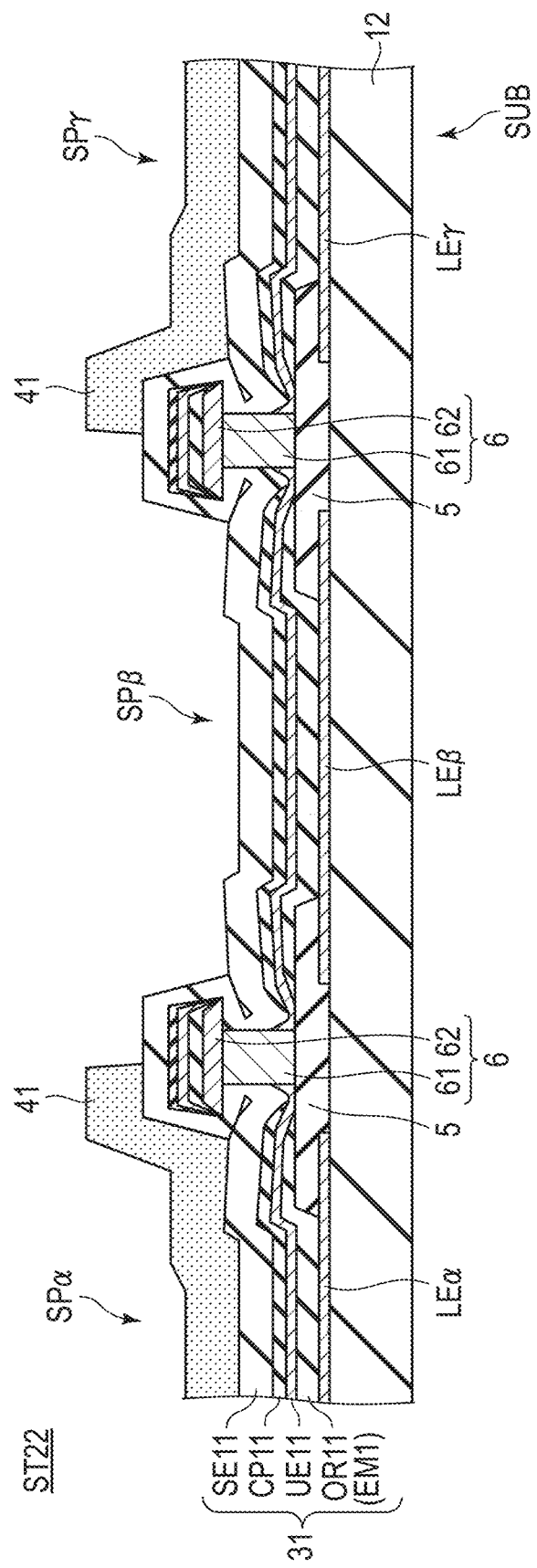
FIG. 9 is a diagram for explaining a step of forming a first resist 41.

Then, in step ST22, the first resist 41 is formed as shown in FIG. 9. The first resist 41 is formed to expose the first thin film 31 of the second subpixel SPβ and to cover the first thin film 31 of the first subpixel SPα and the third subpixel SPγ. That is, in the first subpixel SPα and the third subpixel SPγ, the first resist 41 contacts the first sealing layer SE11. In addition, in the second subpixel SPβ, the first sealing layer SE11 is exposed through the first resist 41.

The end portion of the first resist 41 overlaps substantially the center of the partition 6. That is, on the partition 6 between the first subpixel SPα and the second subpixel SPβ, the first resist 41 is disposed on the first subpixel SPα side and exposes the first sealing layer SE11 on the second subpixel SPβ side. In addition, on the partition 6 between the second subpixel SPβ and the third subpixel SPγ, the first resist 41 is disposed on the third subpixel SPγ side and exposes the first sealing layer SE11 on the second subpixel SPβ side.

Figure 10:
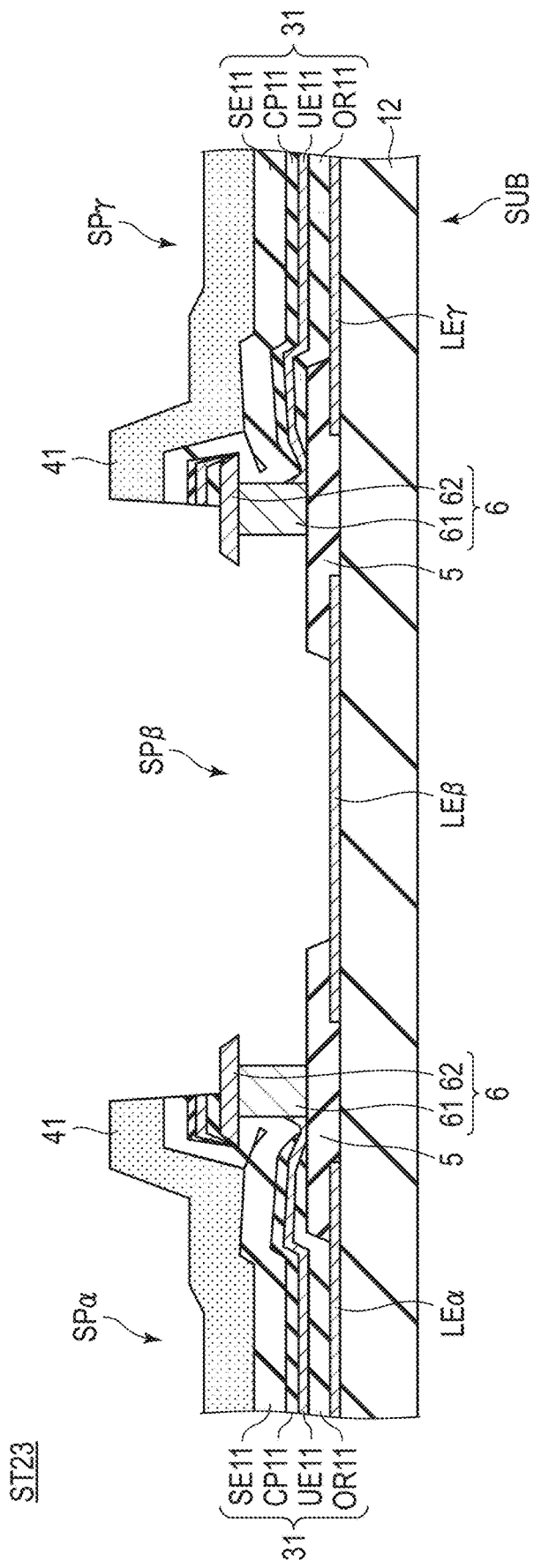
FIG. 10 is a diagram for explaining a step of performing etching with the first resist 41 used as a mask.

Then, in step ST23, as shown in FIG. 10, etching is performed with the first resist 41 used as a mask to remove the first thin film 31 of the second subpixel SPβ, which is exposed through the first resist 41. That is, the first sealing layer SE11, the first cap layer CP11, the first upper electrode UE11, and the first organic layer OR11 in the second subpixel SPβ are removed. In this way, the second lower electrode LEβ of the second subpixel SPβ is exposed and the rib 5 surrounding the second lower electrode LEβ is also exposed.

In addition, on the partition 6 between the first subpixel SPα and the second subpixel SPβ, part of the first sealing layer SE11, part of the first cap layer CP11, part of the first upper electrode UE11, and part of the first organic layer OR11 are removed. The second subpixel SPβ side of the upper portion 62 is thereby exposed.

In addition, on the partition 6 between the second subpixel SPβ and the third subpixel SPγ, part of the first sealing layer SE11, part of the first cap layer CP11, part of the first upper electrode UE11, and part of the first organic layer OR11 are removed. The second subpixel SPβ side of the upper portion 62 is thereby exposed.

Figure 11:
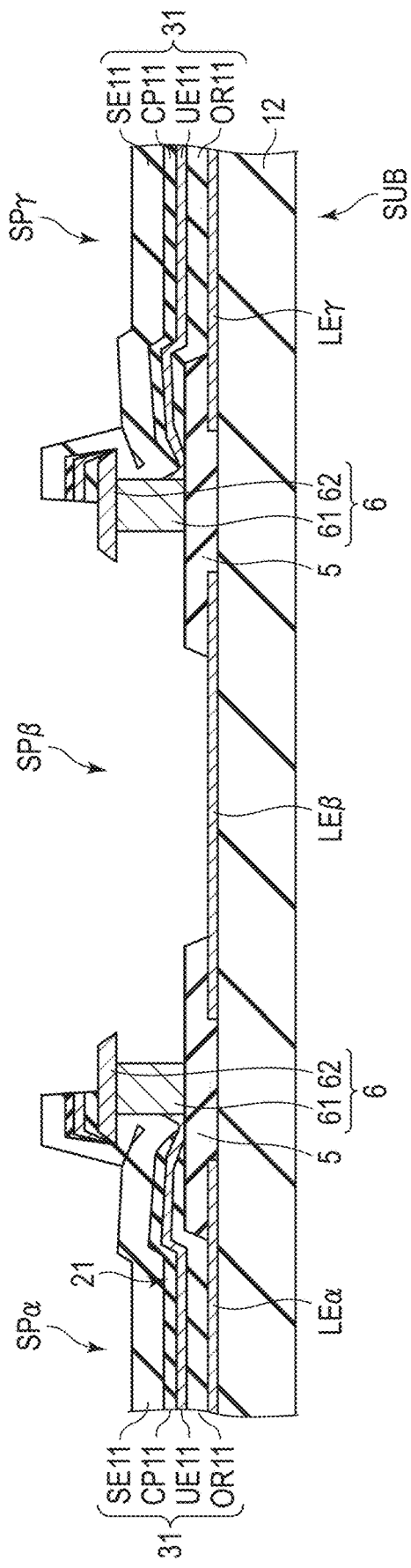
FIG. 11 is a diagram for explaining a step of removing the first resist 41.

Then, in step ST24, the first resist 41 is removed as shown in FIG. 11. The first sealing layer SE11 of the first subpixel SPα and the third subpixel SPγ is thereby exposed. Through steps ST21 to ST24, the display element 21 is formed in the first subpixel SPα. The display element 21 is constituted of the first lower electrode LEα, the first organic layer OR11, the first upper electrode UE11, and the first cap layer CP11. In addition, the display element 21 is covered by the first sealing layer SE11.

Figure 12:
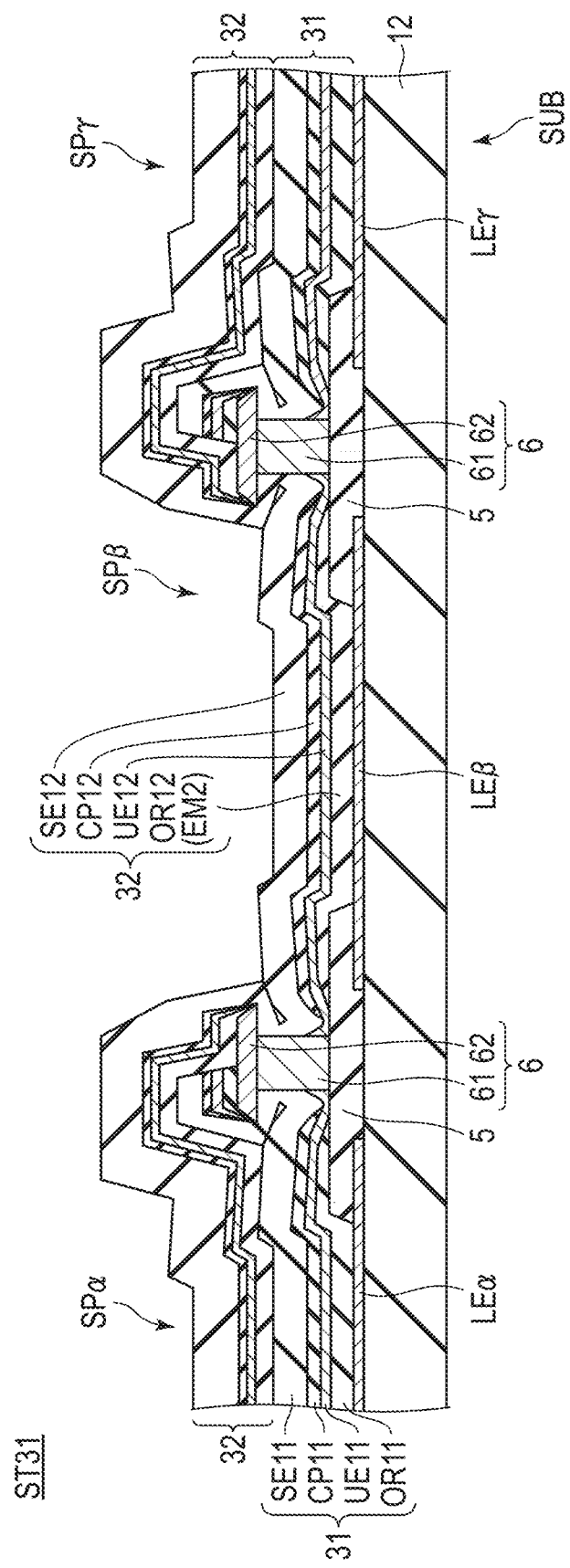
FIG. 12 is a diagram for explaining a step of forming a second thin film 32.

Then, in step ST31, as shown in FIG. 12, the second thin film 32 is formed over the first subpixel SPα, the second subpixel SPβ, and the third subpixel SPγ. The step of forming the second thin film 32 includes the steps of forming a second organic layer OR12 including a second light-emitting layer EM2 which emits light of a second color different from the first color; forming a second upper electrode UE12 on the second organic layer OR12; forming a second cap layer CP12 on the second upper electrode UE12; and forming a second sealing layer SE12 on the second cap layer CP12. The second sealing layer SE12 here is formed of the same inorganic material as that of the first sealing layer SE11.

The second organic layer OR12 is formed on the second lower electrode LEβ, and is also formed on the first sealing layer SE11 of the first subpixel SPα and the third subpixel SPγ. In addition, the second organic layer OR12 is also formed on the upper portion 62 of the partition 6. Of the second organic layer OR12, the portion formed on the upper portion 62 is separated from the portion formed on the second lower electrode LEβ, while it is connected to the portion formed directly above the first lower electrode LEα and the portion formed directly above the third lower electrode LEγ.

The second upper electrode UE12 is formed on the second organic layer OR12 directly above the second lower electrode LEβ, and contacts the lower portion 61 of the partition 6. In addition, the second upper electrode UE12 is also formed on the second organic layer OR12 directly above the upper portion 62. For example, the second upper electrode UE12 covers the second organic layer OR12 in the second subpixel SPR. Of the second upper electrode UE12, the portion formed directly above the upper portion 62 is separated from the portion formed directly above the second lower electrode LEβ, while it is connected to the portion formed directly above the first lower electrode LEα and the portion formed directly above the third lower electrode LEγ.

The second cap layer CP12 is formed on the second upper electrode UE12 directly above the second lower electrode LEβ, and is also formed on the second upper electrode UE12 directly above the upper portion 62. Of the second cap layer CP12, the portion formed directly above the upper portion 62 is separated from the portion formed directly above the second lower electrode LEβ, while it is connected to the portion formed directly above the first lower electrode LEα and the portion formed directly above the third lower electrode LEγ.

The second sealing layer SE12 is formed to cover the second cap layer CP12 and the partition 6. That is, the second sealing layer SE12 is formed on the second cap layer CP12 directly above each of the first lower electrode LEα, the second lower electrode LEβ, and the third lower electrode LEγ, and is also formed on the second cap layer CP12 directly above the upper portion 62. Of the second sealing layer SE12, the portion formed directly above the upper portion 62 is connected to the portions formed directly above the lower electrodes.

Figure 13:
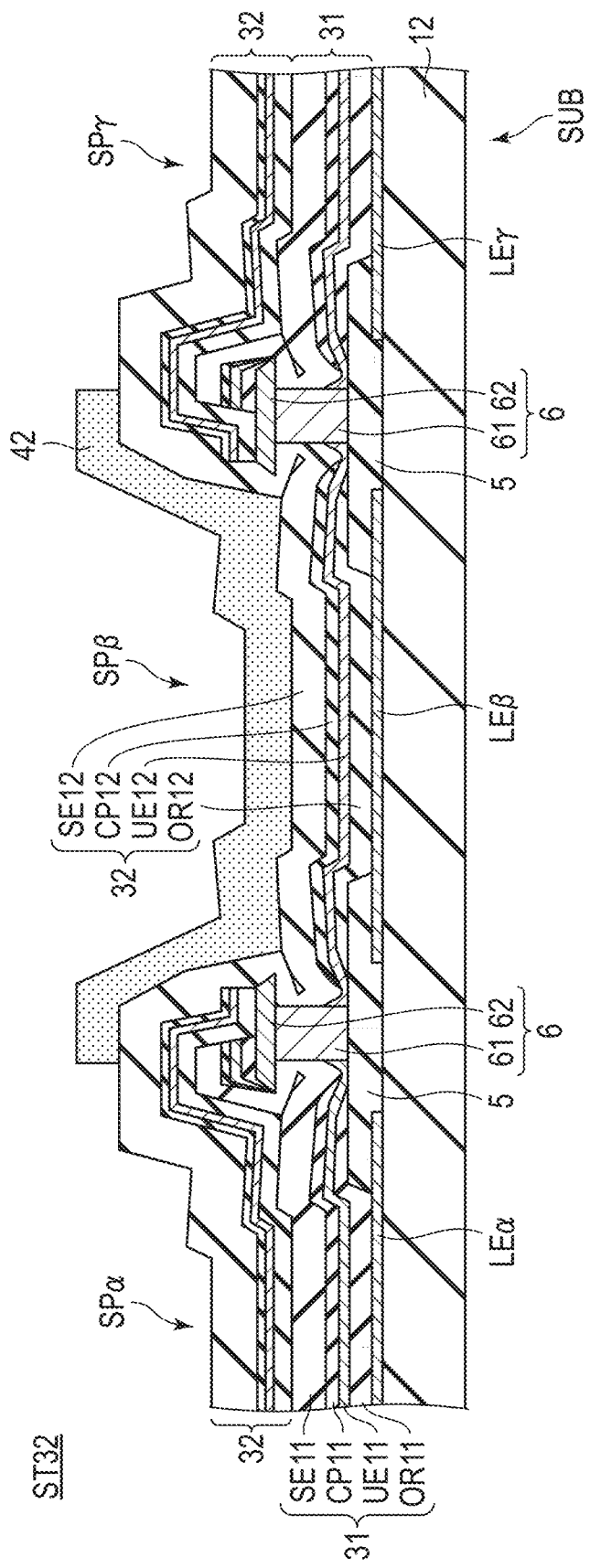
FIG. 13 is a diagram for explaining a step of forming a second resist 42.

Then, in step ST32, the second resist 42 is formed as shown in FIG. 13. The second resist 42 is formed to expose the second thin film 32 of the first subpixel SPα and the third subpixel SPγ and to cover the second thin film 32 of the second subpixel SPβ. That is, in the second subpixel SPβ, the second resist 42 contacts the second sealing layer SE12.

In addition, in the first subpixel SPα and the third subpixel SPγ, the second sealing layer SE12 is exposed through the second resist 42.

The end portion of the second resist 42 overlaps substantially the center of the partition 6. That is, on the partition 6 between the first subpixel SPα and the second subpixel SPβ, the second resist 42 is disposed on the second subpixel SPβ side and exposes the second sealing layer SE12 on the first subpixel SPα side. In addition, on the partition 6 between the second subpixel SPβ and the third subpixel SPγ, the second resist 42 is disposed on the second subpixel SPβ side and exposes the second sealing layer SE12 on the third subpixel SPγ side.

Figure 14:
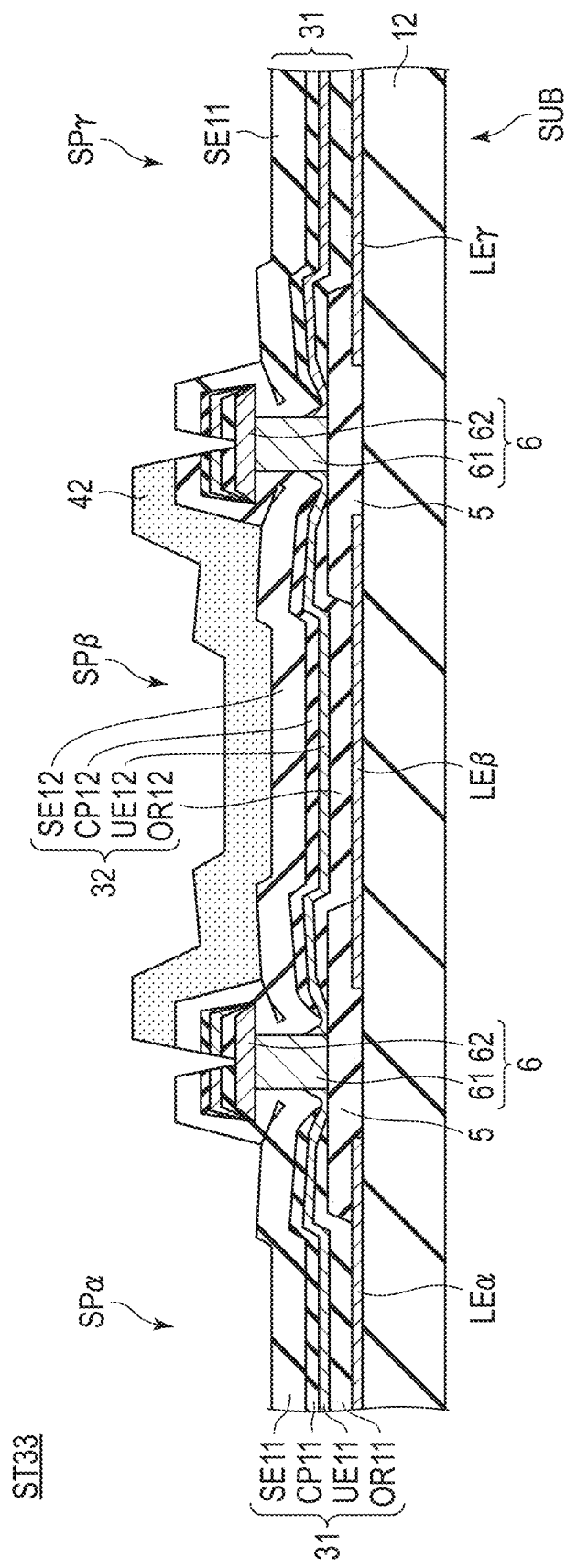
FIG. 14 is a diagram for explaining a step of performing etching with the second resist 42 used as a mask.

Then, in step ST33, as shown in FIG. 14, etching is performed with the second resist 42 used as a mask to remove the second thin film 32 of the first subpixel SPα and the third subpixel SPγ, which is exposed through the second resist 42. That is, the second sealing layer SE12, the second cap layer CP12, the second upper electrode UE12, and the second organic layer OR12 in the first subpixel SPα and the third subpixel SPγ are removed. The first sealing layer SE11 of the first subpixel SPα and the third subpixel SPγ is thereby exposed.

In addition, on the partition 6 between the first subpixel SPα and the second subpixel SPβ, part of the second sealing layer SE12, part of the second cap layer CP12, part of the second upper electrode UE12, and part of the second organic layer OR12 are removed.

In addition, on the partition 6 between the second subpixel SPβ and the third subpixel SPγ, part of the second sealing layer SE12, part of the second cap layer CP12, part of the second upper electrode UE12, and part of the second organic layer OR12 are removed. In the example shown in the figure, on the partition 6, the first thin film 31 and the second thin film 32 are separated from each other. That is, the second sealing layer SE12, the second cap layer CP12, the second upper electrode UE12, and the second organic layer OR12 which remain on the partition 6 are separated from the first sealing layer SE11, the first cap layer CP11, the first upper electrode UE11, and the first organic layer OR11 which remain on the partition 6.

Figure 15:
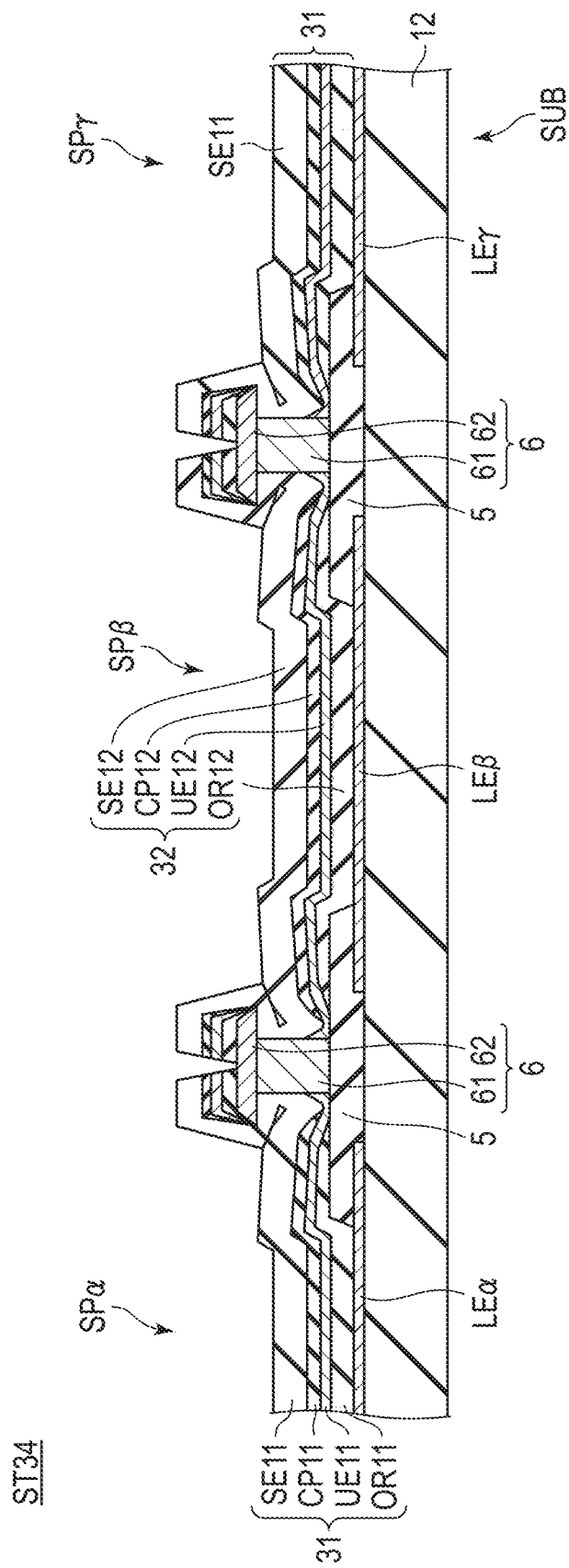
FIG. 15 is a diagram for explaining a step of removing the second resist 42.

Then, in step ST34, the second resist 42 is removed as shown in FIG. 15. The second sealing layer SE12 of the second subpixel SPβ is thereby exposed. Through steps ST31 to ST34, the display element 22 is formed in the second subpixel SPβ. The display element 22 is constituted of the second lower electrode LEβ, the second organic layer OR12, the second upper electrode UE12, and the second cap layer CP12. In addition, the display element 22 is covered by the second sealing layer SE12.

Figure 16:
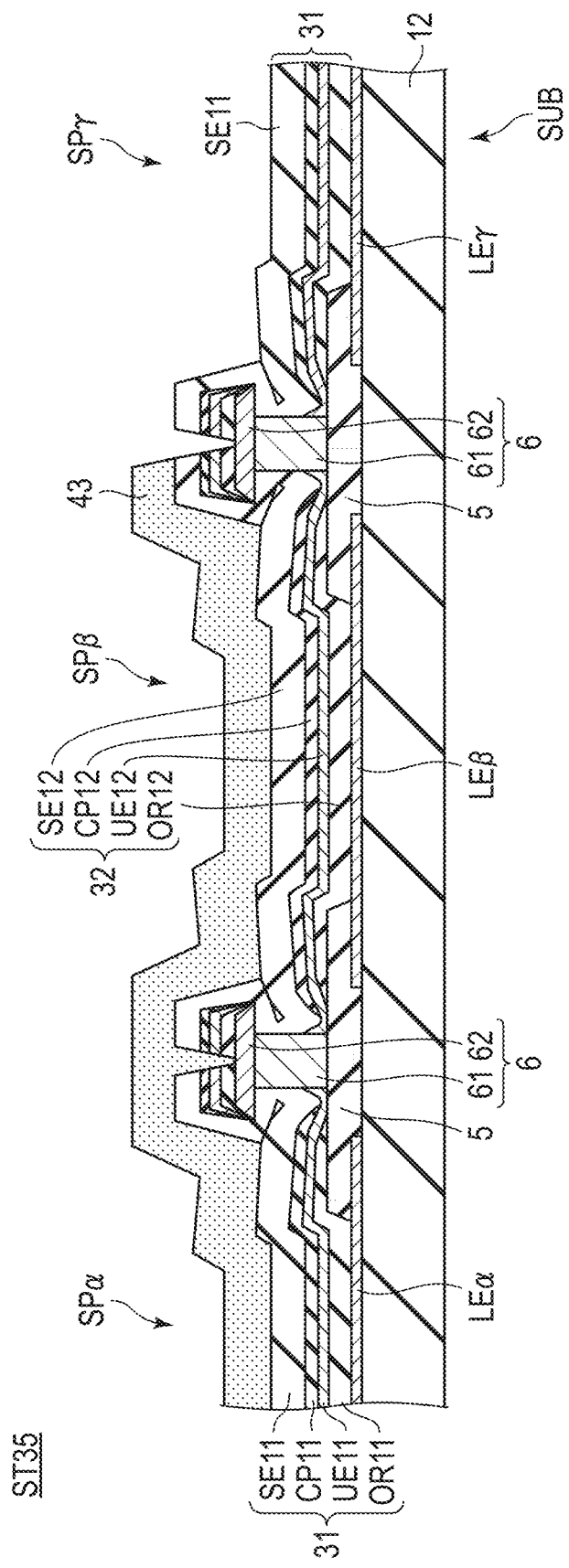
FIG. 16 is a diagram for explaining a step of forming a third resist 43.

Then, in step ST35, the third resist 43 is formed as shown in FIG. 16. The third resist 43 is formed to expose the first thin film 31 of the third subpixel SPγ and to cover the first thin film 31 of the first subpixel SPα and the second thin film 32 of the second subpixel SPR. That is, in the first subpixel SPα, the third resist 43 contacts the first sealing layer SE11. In addition, in the second subpixel SPβ, the third resist 43 contacts the second sealing layer SE12. Further, in the third subpixel SPγ, the first sealing layer SE11 is exposed through the third resist 43. Moreover, on the partition 6 between the first subpixel SPα and the second subpixel SPβ, the third resist 43 covers the first thin film 31 and the second thin film 32.

The end portion of the third resist 43 overlaps substantially the center of the partition 6. That is, on the partition 6 between the second subpixel SPβ, and the third subpixel SPγ, the third resist 43 is disposed on the second subpixel SPβ side and exposes the first sealing layer SE11 on the third subpixel SPγ side.

Figure 17:
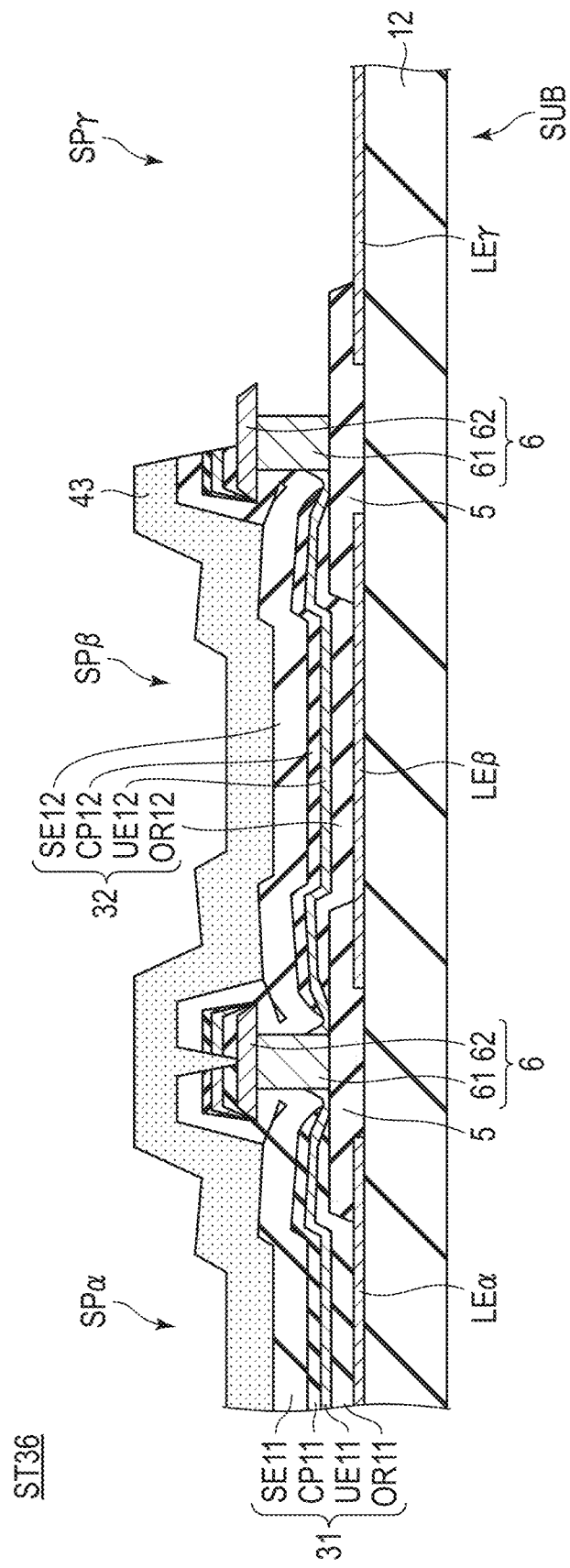
FIG. 17 is a diagram for explaining a step of performing etching with the third resist 43 used as a mask.

Then, in step ST36, as shown in FIG. 17, etching is performed with the third resist 43 used as a mask to remove the first thin film 31 of the third subpixel SPγ, which is exposed through the third resist 43. That is, the first sealing layer SE11, the first cap layer CP11, the first upper electrode UE11, and the first organic layer OR11 in the third subpixel SPγ are removed. In this way, the third lower electrode LEγ of the third subpixel SPγ is exposed and the rib 5 surrounding the third lower electrode LEγ is also exposed.

In addition, on the partition 6 between the second subpixel SPβ and the third subpixel SPγ, part of the first sealing layer SE11, part of the first cap layer CP11, part of the first upper electrode UE11, and part of the first organic layer OR11 are removed. The third subpixel SPγ side of the upper portion 62 is thereby exposed.

Figure 18:
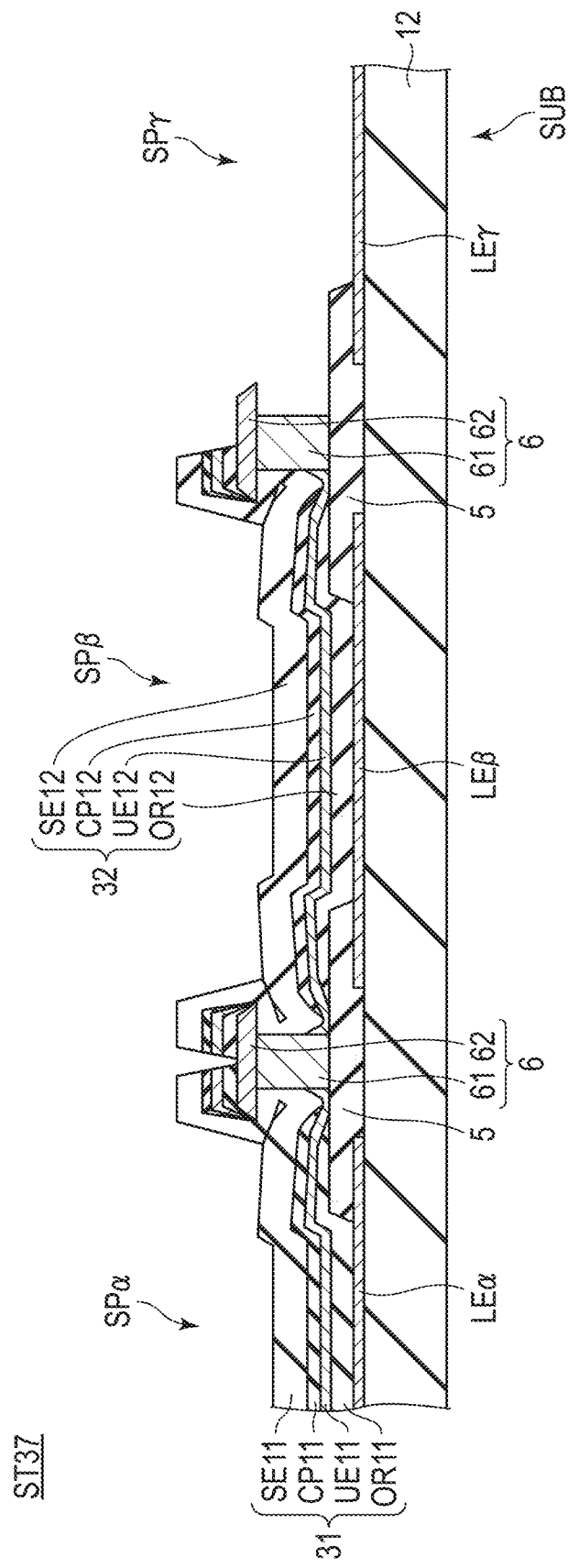
FIG. 18 is a diagram for explaining a step of removing the third resist 43.

Then, in step ST37, the third resist 43 is removed as shown in FIG. 18. In this way, the first sealing layer SE11 of the first subpixel SPα is exposed and the second sealing layer SE12 of the second subpixel SPβ is exposed.

Figure 19:
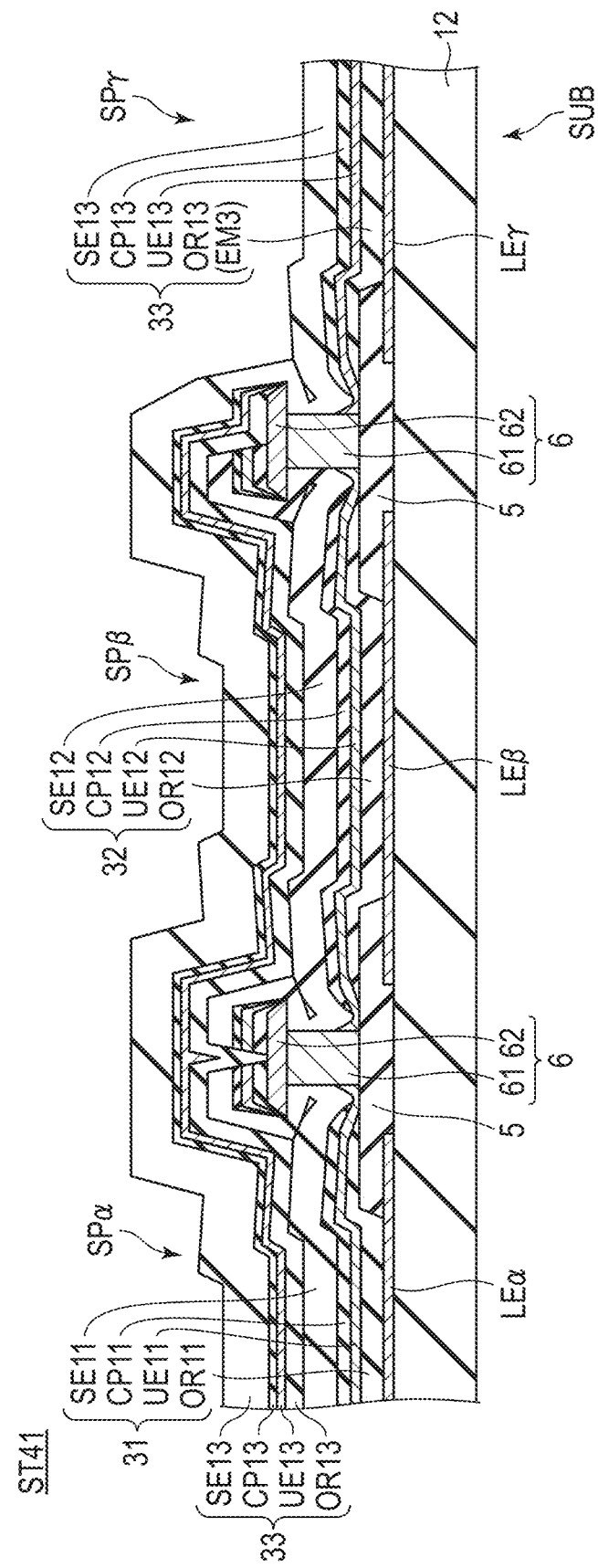
FIG. 19 is a diagram for explaining a step of forming a third thin film 33.

Then, in step ST41, as shown in FIG. 19, the third thin film 33 is formed over the first subpixel SPα, the second subpixel SPβ, and the third subpixel SPγ. The step of forming the third thin film 33 includes the steps of forming a third organic layer OR13 including a third light-emitting layer EM3 which emits light of a third color different from the first color and the second color; forming a third upper electrode UE13 on the third organic layer OR13; forming a third cap layer CP13 on the third upper electrode UE13; and forming a third sealing layer SE13 on the third cap layer CP13. The third sealing layer SE13 here is formed of the same inorganic material as those of the first sealing layer SE11 and the second sealing layer SE12.

The third organic layer OR13 is formed on the third lower electrode LEγ, is also formed on the first sealing layer SE11 of the first subpixel SPα, and is also formed on the second sealing layer SE12 of the second subpixel SPβ. In addition, the third organic layer OR13 is also formed on the upper portion 62 of the partition 6. On the partition 6 between the first subpixel SPα and the second subpixel SPβ, the third organic layer OR13 covers the first thin film 31 and the second thin film 32, and is connected to the portion formed directly above the first lower electrode LEα and the portion formed directly above the second lower electrode LEβ. Of the third organic layer OR13 on the partition 6 between the second subpixel SPβ and the third subpixel SPγ, the portion formed on the upper portion 62 is separated from the portion formed on the third lower electrode LEγ, while it is connected to the portion formed directly above the second lower electrode LEβ.

The third upper electrode UE13 is formed on the third organic layer OR13 directly above the third lower electrode LEγ, and contacts the lower portion 61 of the partition 6. In addition, the third upper electrode UE13 is also formed on the third organic layer OR13 directly above the upper portion 62. For example, the third upper electrode UE13 covers the third organic layer OR13 in the third subpixel SPγ. Of the third upper electrode UE13, the portion formed directly above the upper portion 62 is separated from the portion formed directly above the third lower electrode LEγ, while it is connected to the portion formed directly above the second lower electrode LEβ.

The third cap layer CP13 is formed on the third upper electrode UE13 directly above the third lower electrode LEγ, and is also formed on the third upper electrode UE13 directly above the upper portion 62. Of the third cap layer CP13, the portion formed directly above the upper portion 62 is separated from the portion formed directly above the third lower electrode LEγ, while it is connected to the portion formed directly above the second lower electrode LEβ.

The third sealing layer SE13 is formed to cover the third cap layer CP13 and the partition 6. That is, the third sealing layer SE13 is formed on the third cap layer CP13 directly above each of the first lower electrode LEα, the second lower electrode LEβ, and the third lower electrode LEγ, and is also formed on the third cap layer CP13 directly above the upper portion 62. Of the third sealing layer SE13, the portion formed directly above the upper portion 62 is connected to the portions formed directly above the lower electrodes.

Figure 20:
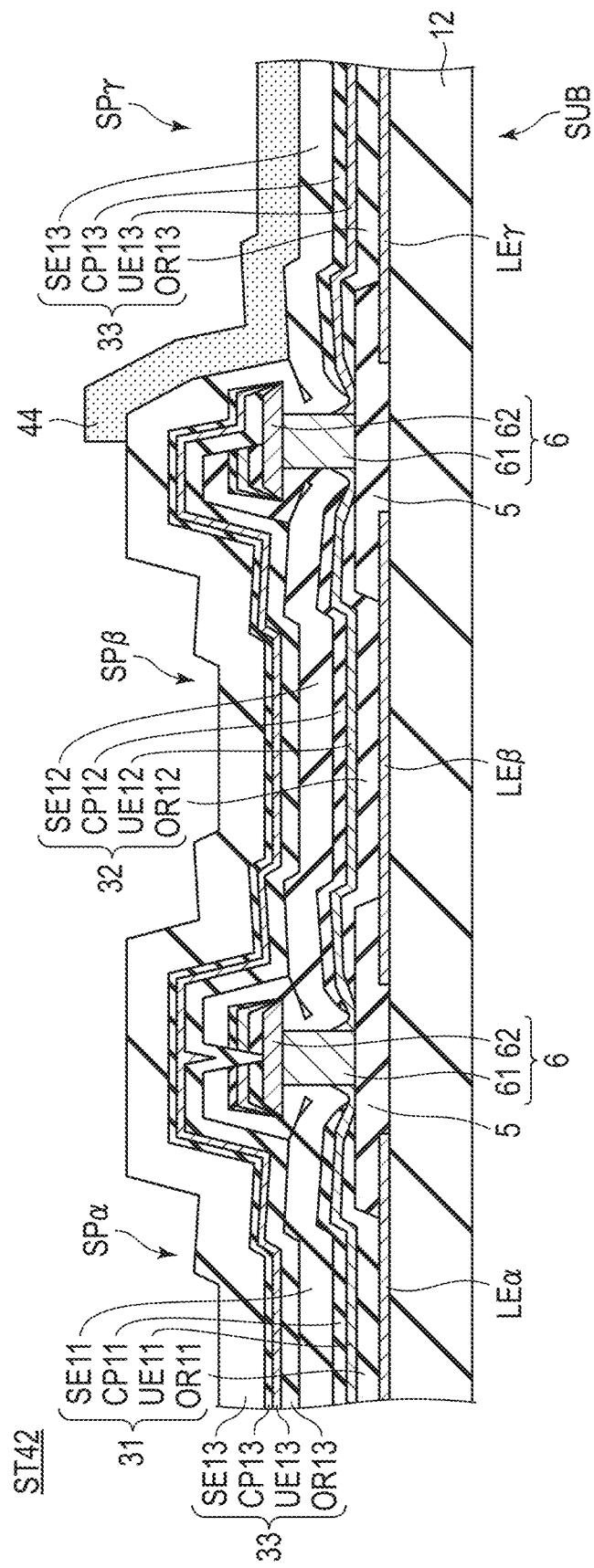
FIG. 20 is a diagram for explaining a step of forming a fourth resist 44.

Then, in step ST42, the fourth resist 44 is formed as shown in FIG. 20. The fourth resist 44 is formed to expose the third thin film 33 of the first subpixel SPα and the second subpixel SPβ and to cover the third thin film 33 of the third subpixel SPγ. That is, in the third subpixel SPγ, the fourth resist 44 contacts the third sealing layer SE13. In addition, in the first subpixel SPα and the second subpixel SPβ, the third sealing layer SE13 is exposed through the fourth resist 44.

The end portion of the fourth resist 44 overlaps substantially the center of the partition 6. That is, on the partition 6 between the second subpixel SPβ and the third subpixel SPγ, the fourth resist 44 is disposed on the third subpixel SPγ side and exposes the third sealing layer SE13 on the second subpixel SPβ side.

Figure 21:
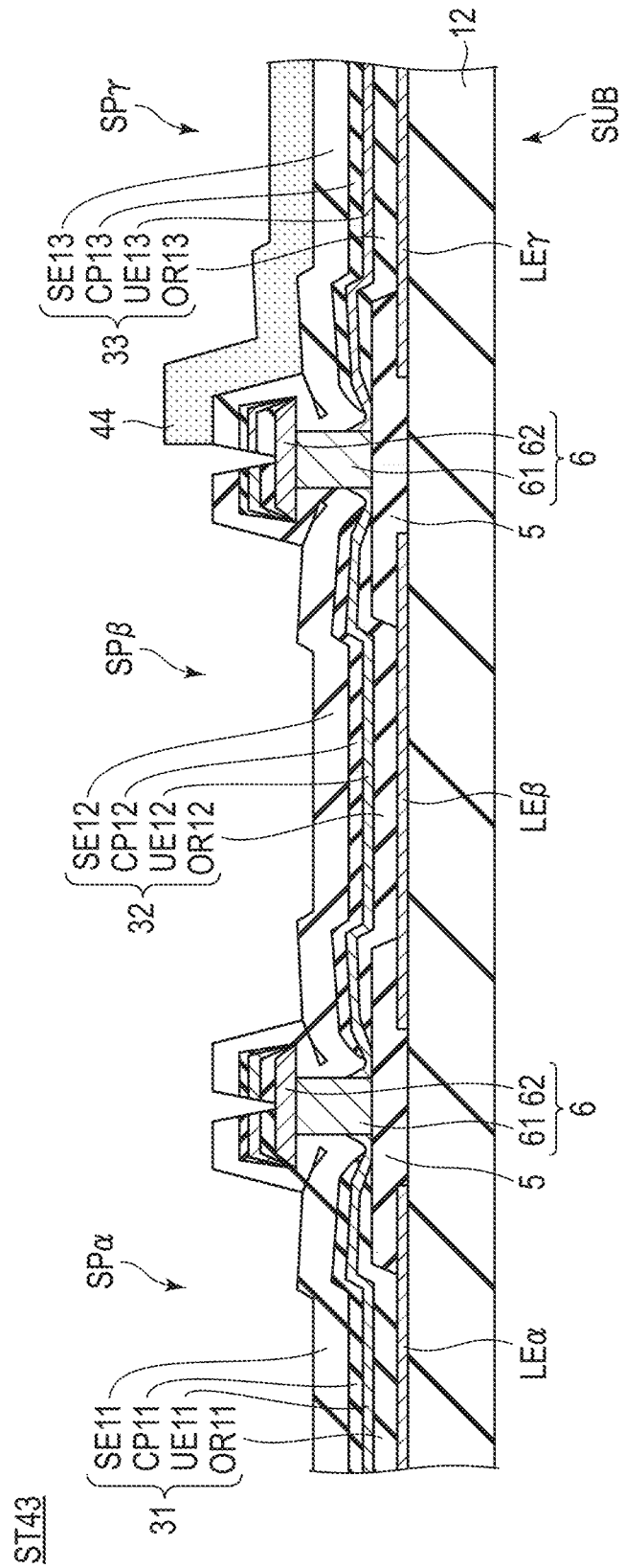
FIG. 21 is a diagram for explaining a step of performing etching with the fourth resist 44 used as a mask.

Then, in step ST43, as shown in FIG. 21, etching is performed with the fourth resist 44 used as a mask to remove the third thin film 33 of the first subpixel SPα and the second subpixel SPβ, which is exposed through the fourth resist 44. That is, the third sealing layer SE13, the third cap layer CP13, the third upper electrode UE13, and the third organic layer OR13 in the first subpixel SPα and the second subpixel SPβ are removed. In this way, the first sealing layer SE11 of the first subpixel SPα is exposed and the second sealing layer SE12 of the second subpixel SPβ is exposed.

In addition, on the partition 6 between the first subpixel SPα and the second subpixel SPβ, the third sealing layer SE13, the third cap layer CP13, the third upper electrode UE13, and the third organic layer OR13 are removed.

In addition, on the partition 6 between the second subpixel SPβ and the third subpixel SPγ, part of the third sealing layer SE13, part of the third cap layer CP13, part of the third upper electrode UE13, and part of the third organic layer OR13 are removed. In the example shown in the figure, on the partition 6, the second thin film 32 and the third thin film 33 are separated from each other.

Figure 22:
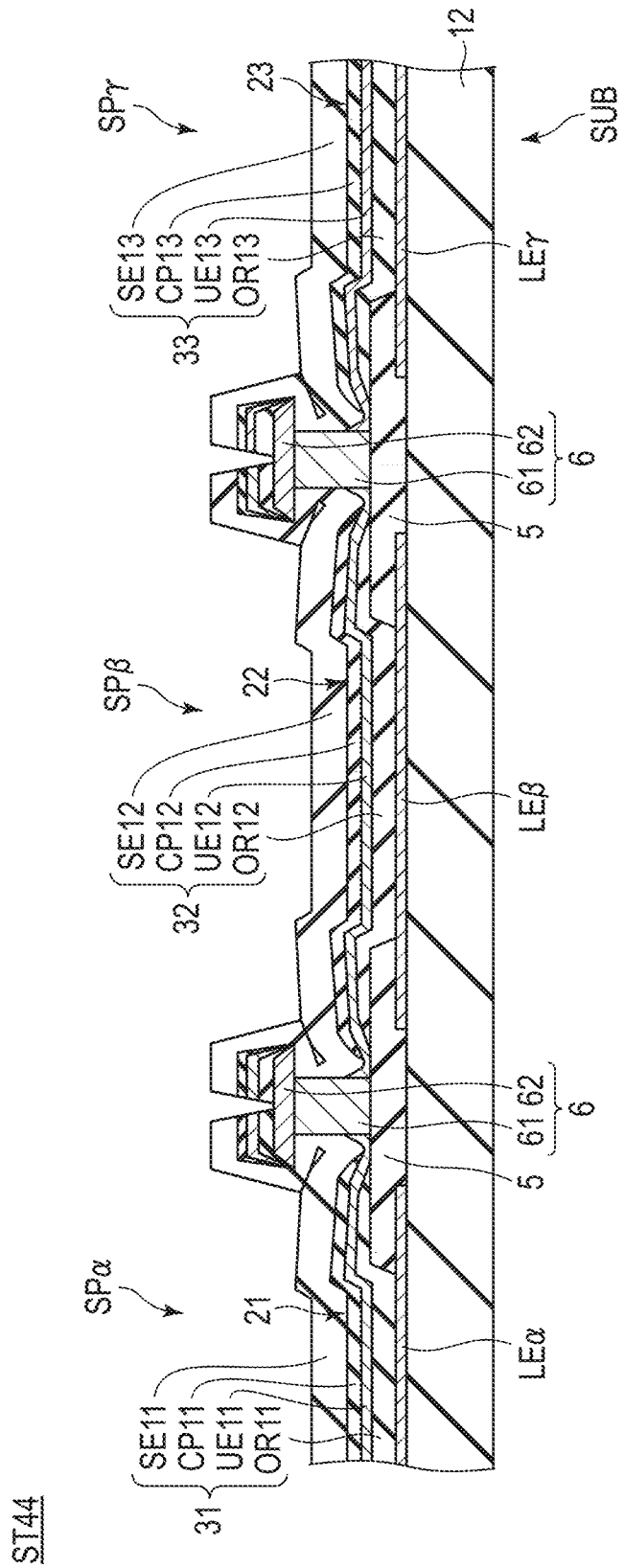
FIG. 22 is a diagram for explaining a step of removing the fourth resist 44.

Then, in step ST44, the fourth resist 44 is removed as shown in FIG. 22. The third sealing layer SE13 of the third subpixel SPγ is thereby exposed. Through steps ST41 to ST44, the display element 23 is formed in the third subpixel SPγ. The display element 23 is constituted of the third lower electrode LEγ, the third organic layer OR13, the third upper electrode UE13, and the third cap layer CP13. In addition, the display element 23 is covered by the third sealing layer SE13.

Through the above-described steps, the display element 21 is formed in the first subpixel SPα, the display element 22 is formed in the second subpixel SPβ, and the display element 23 is formed in the third subpixel SPγ.

According to the present embodiment, damage to the rib 5 caused by performing etching more than once can be suppressed. For example, the rib 5 surrounding the second lower electrode LEβ is exposed when the first thin film 31 is etched as shown in FIG. 10, but is not exposed by etching in the preceding and following steps. In addition, the rib 5 surrounding the third lower electrode LEγ is exposed when the first thin film 31 is etched as shown in FIG. 17, but is not exposed by etching in the preceding and following steps. Accordingly, the formation of an undesirable hole (path for entry of moisture) which penetrates the rib 5 to the insulating layer 12 can be suppressed. Accordingly, the reliability can be improved.

For example, in the above-described example, if the first subpixel SPα corresponds to the above-described subpixel SP1, the first lower electrode LEα corresponds to the lower electrode LE1, the first organic layer OR11 corresponds to the organic layer OR1 comprising the first portion OR1a and the second portion OR1b, the first upper electrode UE11 corresponds to the upper electrode UE1 comprising the first portion UE1a and the second portion UE1b, the first cap layer CP11 corresponds to the cap layer CP1 comprising the first portion CP1a and the second portion CP1b, and the first sealing layer SE11 corresponds to the sealing layer SE1.

As described above, the present embodiment can provide a method of manufacturing a display device which can improve reliability and manufacturing yield.

The present invention is not limited to the embodiments described above but the constituent elements of the invention can be modified in various manners without departing from the spirit and scope of the invention. Various aspects of the invention can also be extracted from any appropriate combination of a plurality of constituent elements disclosed in the embodiments. Some constituent elements may be deleted in all of the constituent elements disclosed in the embodiments. The constituent elements described in different embodiments may be combined arbitrarily.

What is claimed is:

1. A method of manufacturing a display device, comprising:
   preparing a processing substrate comprising a first subpixel, a second subpixel, and a third subpixel;
   forming a first thin film including a first light-emitting layer over the first subpixel, the second subpixel, and the third subpixel;
   forming a first resist which exposes the first thin film of the second subpixel and which covers the first thin film of the first subpixel and the third subpixel;
   removing the first thin film of the second subpixel with the first resist used as a mask;
   removing the first resist;
   forming a second thin film including a second light-emitting layer over the first subpixel, the second subpixel, and the third subpixel;
   forming a second resist which exposes the second thin film of the first subpixel and the third subpixel and which covers the second thin film of the second subpixel;
   removing the second thin film of the first subpixel and the third subpixel with the second resist used as a mask;
   removing the second resist;
   forming a third resist which exposes the first thin film of the third subpixel and which covers the first thin film of the first subpixel and the second thin film of the second subpixel;
   removing the first thin film of the third subpixel with the third resist used as a mask;
   removing the third resist;

forming a third thin film including a third light-emitting layer over the first subpixel, the second subpixel, and the third subpixel;

forming a fourth resist which exposes the third thin film of the first subpixel and the second subpixel and which covers the third thin film of the third subpixel;

removing the third thin film of the first subpixel and the second subpixel with the fourth resist used as a mask; and removing the fourth resist.

2. The method of manufacturing the display device of claim 1, wherein the preparing of the processing substrate comprises:

forming a first lower electrode of the first subpixel, a second lower electrode of the second subpixel, and a third lower electrode of the third subpixel above a substrate;

forming a rib comprising apertures which overlap the first lower electrode, the second lower electrode, and the third lower electrode, respectively; and forming a partition including a lower portion which is disposed on the rib and an upper portion which is disposed on the lower portion and which projects from a side surface of the lower portion.

3. The method of manufacturing the display device of claim 2, wherein the rib is formed of an inorganic material.

4. The method of manufacturing the display device of claim 2, wherein the lower portion of the partition is formed of a conductive material.

5. The method of manufacturing the display device of claim 2, wherein the forming of the first thin film comprises:

forming a first organic layer including the first light-emitting layer on the first lower electrode, the second lower electrode, and the third lower electrode;

forming a first upper electrode on the first organic layer;

forming a first cap layer on the first upper electrode; and forming a first sealing layer on the first cap layer.

6. The method of manufacturing the display device of claim 5, wherein the forming of the second thin film comprises:

forming a second organic layer including the second light-emitting layer on the second lower electrode and on the first sealing layer of the first subpixel and the third subpixel;

forming a second upper electrode on the second organic layer;

forming a second cap layer on the second upper electrode; and forming a second sealing layer on the second cap layer.

7. The method of manufacturing the display device of claim 6, wherein the forming of the third thin film comprises:

forming a third organic layer including the third light-emitting layer on the third lower electrode, on the first sealing layer of the first subpixel, and on the second sealing layer of the second subpixel;

forming a third upper electrode on the third organic layer;

forming a third cap layer on the third upper electrode; and forming a third sealing layer on the third cap layer.

8. The method of manufacturing the display device of claim 7, wherein the first sealing layer, the second sealing layer, and the third sealing layer are formed of the same inorganic materials.

9. The method of manufacturing the display device of claim 7, wherein the lower portion of the partition is formed of a conductive material, and the first upper electrode, the second upper electrode, and the third upper electrode each contact the lower portion.

10. The method of manufacturing the display device of claim 1, wherein the forming of the first thin film, the forming of the second thin film, and the forming of the third thin film each comprise:

forming an organic layer;

forming an upper electrode on the organic layer;

forming a cap layer on the upper electrode; and forming a sealing layer on the cap layer.

11. The method of manufacturing the display device of claim 10, wherein the sealing layer is formed of an inorganic material.

* * * * *